United States Patent
Ohba et al.

(10) Patent No.: US 8,816,313 B2
(45) Date of Patent: *Aug. 26, 2014

(54) MEMORY ELEMENT AND MEMORY DEVICE

(75) Inventors: Kazuhiro Ohba, Miyagi (JP); Tetsuya Mizuguchi, Kanagawa (JP); Shuichiro Yasuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 461 days.

This patent is subject to a terminal disclaimer.

(21) Appl. No.: 13/060,351

(22) PCT Filed: Aug. 28, 2009

(86) PCT No.: PCT/JP2009/065055
§ 371 (c)(1),
(2), (4) Date: Feb. 23, 2011

(87) PCT Pub. No.: WO2010/026924
PCT Pub. Date: Mar. 11, 2010

(65) Prior Publication Data
US 2011/0155988 A1    Jun. 30, 2011

(30) Foreign Application Priority Data
Sep. 2, 2008  (JP) ............... P2008-224914

(51) Int. Cl.
*H01L 45/00* (2006.01)
(52) U.S. Cl.
CPC .................. *H01L 45/085* (2013.01)
USPC ............. 257/2; 257/4; 257/5; 257/E29.002; 257/E45.001
(58) Field of Classification Search
CPC ............... H01L 45/08; H01L 45/085
USPC ............ 257/2–5, E29.002, E45.001; 365/148
See application file for complete search history.

(56) References Cited

U.S. PATENT DOCUMENTS

| 8,492,740 | B2 * | 7/2013 | Ohba et al. .................... 257/2 |
| 8,569,732 | B2 * | 10/2013 | Yasuda et al. ................. 257/4 |
| 2007/0217252 | A1 | 9/2007 | Symanczyk | |
| 2008/0083918 | A1 | 4/2008 | Aratani et al. | |
| 2012/0294063 | A1 * | 11/2012 | Mizuguchi et al. ........... 365/148 |

FOREIGN PATENT DOCUMENTS

| JP | 2002-536840 | 10/2002 |
| JP | 2006-040946 | 2/2006 |
| JP | 2007-280591 | 10/2007 |
| JP | 2009-043757 | 2/2009 |
| JP | 2009-130344 | 6/2009 |
| WO | 00/48916 | 8/2000 |

OTHER PUBLICATIONS

Translation of JP 2009-130344; Jun. 11, 2009.*

(Continued)

*Primary Examiner* — Allison P Bernstein
(74) *Attorney, Agent, or Firm* — K&L Gates LLP

(57) ABSTRACT

Provided are a memory element and a memory device. A memory layer is provided with an ion source layer. The ion source layer includes Zr (zirconium), Cu (copper), and Al (aluminum) as a metal element together with an ion conductive material such as S (sulfur), Se (selenium), and Te (tellurium) (chalcogen element). The amount of Al in the ion source layer is 30 to 50 atomic percent. The amount of Zr is preferably 7.5 to 25 atomic percent, and more preferably, the composition ratio of Zr to the chalcogen element in total included in the ion source layer (=Zr (atomic percent)/chalcogen element in total (atomic percent)) falls within a range from 0.2 to 0.74.

11 Claims, 17 Drawing Sheets

(56) References Cited

OTHER PUBLICATIONS

Japanese Office Action issued Aug. 28, 2013 for corresponding Japanese Appln. No. 2010-527770.

Nekkei Electronics, vol. 20031.20, pp. 104, "PMC suitable for multilayering of cells", Jan. 20, 2003.

International Search Report dated Oct. 19, 2009, for corresponding Patent Application PCT/JP2009/065055.

* cited by examiner

MEMORY ELEMENT AND MEMORY DEVICE

CROSS REFERENCE TO RELATED APPLICATIONS

The present application is a National Stage of International Application No. PCT/JP2009/065055 filed on Aug. 28, 2009 and which claims priority to Japanese Patent Application No. 2008-224914 filed on Sep. 2, 2008, the entire contents of which are being incorporated herein by reference.

BACKGROUND

The present disclosure relates to a memory element and a memory device that can store therein binary or multivalued information including values greater than binary in response to a change of electrical characteristics observed in a memory layer including an ion source layer.

As a nonvolatile memory from which information is not erased even if power is turned off, previously proposed are a flash memory, a FeRAM (Ferroelectric Random Access Memory), an MRAM (Magnetoresistive Random Access Memory), and others, for example. Such types of memories enable to keep any written information for a long time with no supply of power. However, such types of memories each have advantages and disadvantages. In other words, the flash memory is high in packaging density, but is disadvantageous in terms of operation speed. The FeRAM has the limitations for micromachining to achieve a higher packaging density, and also has a problem in a manufacturing process. The MRAM has a problem of power consumption.

In consideration thereof, proposed is a memory element of a new type being especially advantageous considering the limitations of micromachining of memory elements. This memory element is in the configuration in which two electrodes sandwich therebetween an ion conductor including specific metal. With such a memory element, one of the two electrodes is configured to include metal same as that included in the ion conductor. This allows, at the time of voltage application between the two electrodes, dispersion of the metal in the electrode into the ion conductor as ions, thereby changing the resistance value of the ion conductor or the electrical characteristics such as capacitance. As an example, Patent Literature 1 and Non-patent Literature 1 each describe the configuration of a memory device utilizing such characteristics. Especially Patent Literature 1 proposes to configure an ion conductor by a solid solution of chalcogenide and metal. To be specific, it is made of a material being AsS, GeS, or GeSe, having solid solution of Ag, Cu, or Zn, and one of the two electrodes is configured to include Ag, Cu, and Zn.

CITATION LIST

Patent Literature

Patent Literature 1: Japanese Unexamined Patent Application Publication (Translation of PCT Application) No. 2002-536840

Non-patent Literature

Non-patent Literature 1: Nikkei Electronics 2003.1.20 issue (pp. 104)

SUMMARY

With the memory element described above, however, when the ion conductor is left for a long time in the state of memory with a resistance value thereof being low (e.g., "1") or in the state of deletion with a resistance value thereof being high (e.g., "0"), or when it is left as it is in the atmosphere at the temperature higher than the room temperature, there is a problem of failing in information retention because the resistance value shows a change. If the performance capabilities of information retention (characteristics of resistance value retention) are low as such, such element characteristics are not considered good enough for use in a nonvolatile memory.

Moreover, not only simply "0" indicating the state of high resistance and "1" indicating the state of low resistance, if the memory element is capable of retaining but also a resistance value of any arbitrary intermediate value between several hundred $M\Omega$ indicating the state of high resistance and several $k\Omega$ indicating the state of low resistance, for example, the resulting memory is not only increased in operation margin but also becomes available for multi-level recording. If the memory is capable of storing four states of resistance, for example, it means that it can store information about 2 bits/element, and if the memory is capable of storing 16 resistance values, it means that it can store information about 3 bits/element. Thus, the resulting memories can have the capacities twice and three times larger, respectively.

However, with a previous memory element, if the range allowed for a resistance value to change is from several $k\Omega$ to several hundred $M\Omega$, the resistance value that can be retained in the state of low resistance is about $10 k\Omega$ or smaller, and the resistance value that can be retained in the state of high resistance is about $1M\Omega$ or larger. Thus, there is a problem of difficulty in retaining any resistance value indicating the intermediate state between the states of high resistance and low resistance, thereby resulting in difficulty in realizing the multivalued memory.

A memory element of an embodiment is provided with a first electrode and a second electrode, and a memory layer that is provided between the first and second electrodes, and includes an ion source layer. The ion source layer includes at least Zr and Al together with a chalcogen element of at least one of Te, S, and Se, and an amount of Al in the ion source layer falls within a range from 30 atomic percent to 50 atomic percent both inclusive.

With the memory element of the embodiment, the ion source layer is preferably configured to include Cu together with Zr. Further, an amount of Zr in the ion source layer preferably falls within a range from 7.5 atomic percent to 26 atomic percent both inclusive, and a composition ratio of Zr to the chalcogen element in total included in the ion source layer (=Zr (atomic percent)/chalcogen element in total (atomic percent)) preferably falls within a range from 0.2 to 0.74 both inclusive. Still further, the ion source layer may be configured to include Ge, and if this is the case, an amount of Ge in the ion source layer is set to be 15 atomic percent or smaller. Such a configuration can allow the composition elements to serve their roles best.

A memory device of the embodiment is provided with a plurality of memory elements, and pulse application means. The memory elements each include a memory layer including an ion source layer between a first electrode and a second electrode, and store information in response to any change of electrical characteristics observed in the memory layer. The pulse application means selectively applies a voltage or current pulse to the plurality of memory elements. The memory elements in such a device are the memory elements of the invention.

With the memory element or the memory device of the invention, when a voltage or current pulse of "positive direction" (e.g., the side of the first electrode is at a negative potential, and the side of the second electrode is at a positive potential) is applied to the elements in the initial state (in the state of high resistance), the side of the first electrode is formed with a conductive path of a metal element including Zr, and the state is changed to low resistance. To the elements in such a state of low resistance, when a voltage pulse of "negative direction" (e.g., the side of the first electrode is at a positive potential, and the side of the second electrode is at a negative potential) is applied, the conductive path of the above-described metal is oxidized, and then is dissolved into the ion source layer. Or any additive element existing in the ion source layer such as Zr forms another oxidized film on the anode, and as a result, the state is changed to high resistance.

In this example, because Zr configuring the conductive path is not dissolved that much easily into an ion conductive material (e.g., chalcogenide), when the state is once changed to writing, that is, when the state is changed to low resistance, the state of low resistance becomes easy to retain. On the other hand, also in the state of high resistance during deletion, when Zr is being dissolved as ions (cations) again in the ion source layer, even with a temperature increase or even if it is left as it is for a long time, Zr has difficulty in moving as is low in ion mobility compared with any other elements at least including Cu or others. Therefore, such a phenomenon as precipitation of Zr hardly occurs in the metallic state on the cathode. With another reason, because the Zr oxide is stable in the chalcogenide electrolyte, and because the oxide is not degraded easily, the state of high resistance is maintained even if the oxide is left in the state of a high temperature higher than a room temperature or even if it is left for a long time. Moreover, because Al forms an oxidized coating film on the anode, the state of high resistance is thereby maintained, and the characteristics of a repeated operation are improved from the viewpoint of self-reproduction of such a film being high in resistance. Furthermore, by combining Zr with Cu, amorphization in the resulting layer is promoted, and this helps to keep uniform the microstructure of the ion source layer, thereby being able to improve more the characteristics of resistance value retention.

According to the memory element and the memory device of the embodiment, the ion source layer includes at least Zr and Al in addition to a chalcogen element, and the amount of Al is set to 30 to 50 atomic percent. This accordingly increases the frequency of repeated operation, and cancels the trade-off relationship between the performance capabilities of a high-speed operation for writing and deletion, and the characteristics of resistance value retention during the high-speed operation so that the resulting memory element can have an excellent balance between such two types of performance capabilities. Moreover, with the characteristics of resistance value retention improved as such, the intermediate state between the state of high resistance and the state of low resistance can be produced by adjusting the level of a deletion voltage during the state change from low resistance to high resistance, for example. This accordingly enables multivalued memory, thereby being able to realize the larger capacity.

Additional features and advantages are described herein, and will be apparent from, the following Detailed Description and the figures.

DETAILED DESCRIPTION

Figure 1:
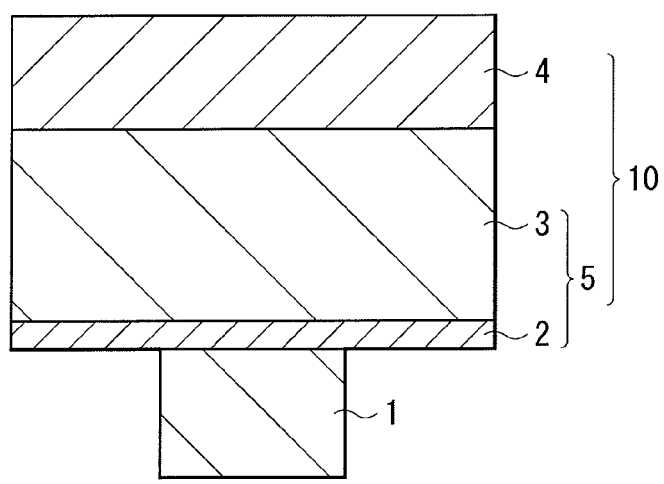
FIG. 1 A cross sectional view of a memory element in an embodiment, showing the configuration thereof.
Figure 2:
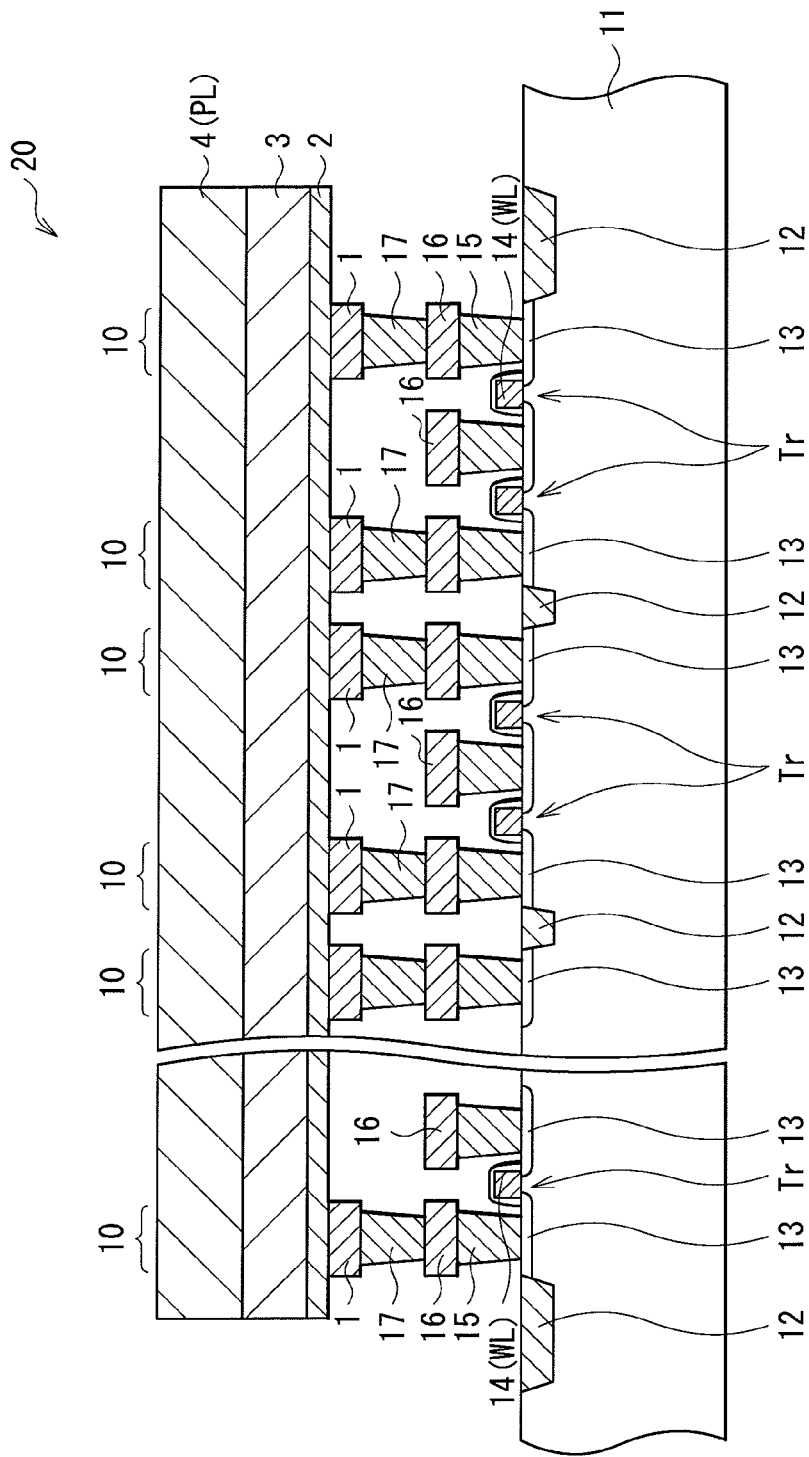
FIG. 2 A cross sectional view of a memory cell array using the memory element of FIG. 1, showing the schematic configuration thereof.

FIG. 1 is a cross sectional view of a memory element 10 in one embodiment, showing the configuration thereof. This memory device 10 is provided with a memory layer 5 between a lower electrode 1 (first electrode) and an upper electrode 4 (second electrode). In this configuration, the lower electrode 1 is disposed on a silicon substrate 11, which is formed thereon with a CMOS (ComplementaryMetalOxide Semiconductor) circuit as will be described later (FIG. 2). The lower electrode 1 serves as a connection portion with the part of the CMOS circuit.

The lower electrode 1 can be made of a wiring material for use in a semiconductor process, e.g., W (tungsten), WN (tungsten nitride), Cu (copper), Al (aluminum), Mo (molybdenum), Ta (tantalum), and silicide. When any material in use has a possibility of causing ion conduction in the magnetic field of Cu, for example, the electrode made of Cu or others may be coated by a material such as W, WN, TiN (titanium nitride), and TaN (tantalum nitride) that does not easily cause ion conduction or thermal diffusion.

The memory layer 5 is configured by a high-resistance layer 2 and an ion source layer 3. The ion source layer 3 includes Zr (zirconium) and Cu (copper) as a metal element that can be cationized, one or more of chalcogenide elements including S (sulfur), Se (selenium), and Te (tellurium) as an ion conductive material that can be anionized, and Al (aluminum) and Ge (germanium) as an element for oxide formation during deletion. To be specific, the ion source layer 3 can be made of an ion source layer material with the composition of ZrTeAl, ZrTeAlGe, CuZrTeAl, CuZrTeAlGe, and others. Note here that this is surely not restrictive, and any other elements, e.g., Si (silicon), may be included.

The amount of Al in the ion source layer 3 is 30 to 50 atomic percent. Moreover, the amount of Zr in the ion source layer 3 is preferably 7.5 to 26 atomic percent, and the composition ratio of Zr to the chalcogen element in total included in the ion source layer 3 (=Zr (atomic percent)/chalcogen element in total (atomic percent)) preferably falls within a range from 0.2 to 0.74. Moreover, the amount of Ge in the ion source layer 3 is preferably 15 atomic percent or smaller. Such a configuration can allow the composition elements to serve their roles best. The details thereabout will be described later.

The high-resistance layer 2 can be made of any type of material as long as it is an insulator or a semiconductor that remains stable even if it is in contact with the ion source layer 3 made of Zr, or Zr and Cu, and Al—chalcogenide. However, the high-resistance layer 2 may be preferably made of a rare-earth element such as Gd (gadolinium), or oxides or nitrides including at least one of Al, Mg (magnesium), Ta, Si (silicon), and Cu. Note that the high-resistance layer 2 is not an essential component in the invention, but for stabilizing the characteristics of information retention, the high-resistance layer 2 is preferably provided. If provided, the high-resistance layer 2 is formed so as to come in contact with the side of the lower electrode 1 as shown in FIG. 1.

The upper electrode 4 can be made of any known semiconductor wiring material similarly to the lower electrode 1.

In the memory element 10 in the embodiment, when a voltage pulse or a current pulse comes from a power source (pulse application means) that is not shown via the lower electrode 1 and the upper electrode 4 described above, the memory layer 5 is changed in electrical characteristics, e.g., resistance value, thereby performing writing, deletion, and reading of information. In the below, the operation thereof is specifically described.

First of all, a positive voltage is applied to the memory element 10 in such a manner that the upper electrode 4 is at a positive potential, and the side of the lower electrode 1 is at a negative potential, for example. This accordingly causes ion conduction of cations of Cu and Zr from the ion source layer 3, and then the cations bond with electrons on the side of the lower electrode 1, resulting in precipitation. As a result, the interface between the lower electrode 1 and the memory layer 5 is formed thereon with a conductive path (filament) made of Zr and Cu, which are both low in resistance and reduced to the metallic state. Alternatively, a conductive path is formed in the high-resistance layer 2. Thus, the memory layer 5 is reduced in resistance value, and the state of resistance is changed from the initial high state to a low state.

Thereafter, even if the memory element 10 becomes free of voltage with the positive voltage removed, the state of low resistance is retained. This means information writing is done. When a memory device in use is available for writing one time only, i.e., so-called PROM (ProgrammableRead OnlyMemory), the recording is completed only with the recording process described above. On the other hand, the deletion process is required for application to a memory device that is erasable, that is, for application to a RAM (Random Access Memory) or an EEPROM (Electronically Erasable and Programmable Read Only Memory), for example. In the deletion process, the memory element 10 is applied with a negative voltage in such a manner that the upper electrode 4 is at a negative potential, and the lower electrode 1 is at a positive potential, for example. In this manner, Zr and Cu in the conductive path formed inside of the memory layer 5 are oxidized and then are ionized, and the resultant is then dissolved into the ion source layer 3 or is bonded with Te or others, thereby forming a compound such as $Cu_2Te$, CuTe, and others. In response thereto, the conductive path made of Zr and Cu disappears or is reduced in amount so that the resistance value is increased. If this is not the case, any additive element such as Al and Ge also in the ion source layer 3 forms an oxidized film on the anode so that the state is changed to high resistance.

Thereafter, even if the memory element 10 becomes free of voltage with the negative voltage removed, the resistance value remains high in state. This means any written information is ready for deletion. By repeating such a process, the memory element 10 can be repeatedly subjected to writing of information and deletion of the written information.

Moreover, if a correlation is established between the state in which the resistance value is high and information of "0", and between the state in which the resistance value is low and information of "1", "0" can be changed to "1" in the process of information recording through application of a positive voltage, and "1" can be changed to "0" in the process of information deletion through application of a negative voltage.

For demodulating any recorded data, the larger ratio is more preferable between the resistance value in the initial stage and the resistance value after the recording. However, when the high-resistance layer 2 has a too large resistance value, this causes difficulty in performing writing, that is, difficulty in making the state low in resistance, and thus a writing threshold voltage becomes too high. In consideration thereof, the initial resistance value is adjusted to be 1 G$\Omega$ or smaller. When the high-resistance layer 2 is formed by an oxide of rare-earth element, for example, the resulting high-resistance value 2 can be controlled in resistance value by the thickness thereof, by the amount of oxygen therein, and others. Note here that when the high-resistance layer 2 is not formed, the deletion current and voltage can be the controlling factors therefor.

As described above, in the memory element 10 in this embodiment, the memory layer 5 is configured to include the high-resistance layer 2, and the ion source layer 3 including Zr, Cu, and Al as a metal element. Accordingly, through application of a voltage or current pulse to the upper electrode 4 and to the lower electrode 1, not only writing of information but also deletion of the written information can be ready.

Herein, due to the provision of the ion source layer 3 including Zr, Cu, and Al as described above, compared with any previous memory element, the memory element in this embodiment shows the better performance capabilities of retaining a wider range of resistance values, and the better performance capabilities of a high-speed operation for writing and deletion. The frequency of repetition is also increased therewith. The reasons thereof are described in the below.

In this embodiment, since the ion source layer 3 includes Zr, or Zr and Cu, such Zr and Cu each function as an ionization element so that the resulting conductive path is made of Zr or a mixture of Zr and Cu. Zr is supposed to be reduced on the cathode during the operation of writing, and in the state of low resistance after the writing, is supposed to form a filament in the metallic state. The metallic filament after the reduction of Zr is not dissolved that much easily into the ion source layer 3 including the chalcogen element of S, Se, and Te. Therefore, once the state is changed to writing state, that is, once the state is changed to low resistance state, the low resistance state is easier to retain than in the case with a conductive path made only of Cu. Cu is formed as a metallic filament by the operation of writing. However, Cu in the metallic state is easily dissolved in the ion source layer including a chalcogen element, and in the state of no application of a voltage pulse for writing (in the state of data retention), Cu in the metallic state is ionized again and then is changed into the high resistance state. As a result, the resulting performance capabilities of data retention cannot be of a satisfactory level. On the other hand, combining Zr with an appropriate amount of Cu contributes to improve the performance capabilities of resistance value retention because amorphization in the resulting layer is promoted, and the microstructure of the ion source layer 3 is thereby kept uniform.

Moreover, for retaining the high resistance state during deletion, when Zr is included, for example, the resulting conductive path includes Zr, and when it is being dissolved as ions again in the ion source layer 3, even with a temperature increase or even if it is left as it is for a long time, Zr has difficulty in moving as is low in ion mobility compared at least with Cu. Therefore, such a phenomenon as precipitation of Zr hardly occurs in the metallic state on the cathode. With another reason, since the Zr oxide is stable in the chalcogenide electrolyte, and since the oxide is not degraded easily, the state of high resistance is maintained even if the oxide is left in the state of a high temperature higher than a room temperature or even if it is left for a long time.

Moreover, when the anode electrode is biased at a lower potential due to the operation of deletion, Al included in the ion source layer 3 stabilizes the state of high resistance (state of deletion) by forming an oxidized film stable on the interface between the ion source layer 3 behaving like a solid electrolyte and the anode. Furthermore, Al contributes to increase the frequency of repetition from the viewpoint of self-reproduction of such a film being high in resistance. Note here that, not only Al but also Ge or others functioning similarly thereto may be included.

As such, in this embodiment, the ion source layer 3 is configured so as to include Al together with a chalcogen element, Zr, or Zr and Cu. Accordingly, a wider range of resistance values can be retained as described above, and if the intermediate state between the state of high resistance and the state of low resistance is produced by adjusting the level of a deletion voltage during the state change from low resistance to high resistance, for example, the state can be retained with a good stability. Thus, implemented is a memory capable of multivalued memory not only of binary.

Herein, such various characteristics considered important for the memory operation, e.g., the characteristics of the operation of writing and deletion for application of a voltage, the characteristics of resistance value retention, and the frequency of repeated operation, vary depending on the amount of addition of Zr, Cu, and Al, and also Ge.

If the amount of Zr is too much, for example, the ion source layer 3 is reduced too much in resistance value, and thus the resulting ion source layer 3 is not provided with an effective level of voltage, or dissolving Zr into the chalcogenide layer becomes difficult. As a result, this causes difficulty especially in deletion, and a threshold voltage for deletion starts increasing based on the addition amount of Zr. If the amount of Zr is much too large, this causes difficulty also in writing, that is, in making the low state in resistance. On the other hand, when the addition amount of Zr is too little, this reduces such effects as described above of improving the characteristics of retaining a wider range of resistance values. In consideration thereof, the amount of Zr in the ion source layer 3 is preferably 7.5 or more, and more preferably, is 26 atomic percent or less.

Moreover, when the ion source layer 3 is added with an appropriate amount of Cu, amorphization in the resulting layer is promoted, but if the amount thereof is too much, the characteristics of writing retention are degraded or the high-speed characteristics during the operation of writing are adversely affected because too much Cu in the metallic state is not stable enough in the ion source layer including a chalcogen element. At the same time, the combination of Zr and Cu produces the effects of being able to easily make the layer amorphous, and to keep uniform the microstructure of the ion source layer 3. Accordingly, not to make non-uniform the material component in the ion source layer 3 due to the repeated operation, the frequency of repetition is increased, and the characteristics of retention are improved. When the amount of Zr is sufficient and is within the range described above, even if the conductive path of Cu is dissolved again into the ion source layer, conductive path of the metal Zr is supposed to still exist, and there thus is no influence on the characteristics of writing retention. Moreover, it may be considered desirable as long as the cations and anions after dissociation and ionization remain equivalent to each other in terms of amount of electrical charge. Accordingly, the preferable addition amount of Cu may be the one when the equivalence ratio between such ions in terms of electrical charge is in a range of {(Maximum Valence Number of Zr Ion×Number of Moles or Atomic percent)+(Valence Number of Cu Ion×Number of Moles or Atomic percent)}/(Valence Number of Chalcogen Element×Number of Moles or Atomic percent)=0.5 to 1.5

However, with the memory element 10 in this embodiment, the characteristics are substantially dependent largely on the composition ratio between Zr and Te. In consideration thereof, the composition ratio between Zr and Te is considered desirable if it falls within the following range.

Composition Ratio of Zr (Atomic percent)/Composition Ratio of Te (Atomic percent)=0.2 to 0.74

This is not always obvious, but the resulting resistance value can be suitable only when the composition ratio is in such a range as above considering that the degree of dissociation of Cu is lower than that of Zr, and the resistance value of the ion source layer 3 is determined based on the composition ratio between Zr and Te. Accordingly, a bias voltage applied to the memory element 10 is supposed to reach effectively the portion of the high-resistance layer 2.

When the value does not fall within such a range as above, e.g., when the equivalence ratio is too high, the balance is lost between the cations and anions, and among the existing metal elements, any element(s) not to be ionized are increased in amount. This may be the reason for not allowing, during the operation of deletion, the effective removal of the conductive path generated by the operation of writing. Similarly, when the anion element exists too much because the equivalence ratio is too low, the conductive path in the metallic state generated by the operation of writing becomes difficult to remain in the metallic state, and thus the characteristics of retaining the state of writing are to be degraded.

Moreover, when the amount of Al is too much, this encourages Al ions to move, and the state of writing is thus created by reduction of the Al ions. Since Al is not high in stability to remain in the metallic state in the solid electrolyte of chalcogenide, the characteristics of retaining the state of writing with low resistance are degraded. On the other hand, when the amount of Al is too little, the effects of improving the operation of deletion itself, and the characteristics of retaining a high-resistance region are reduced, thereby reducing the frequency of repetition. In consideration thereof, the amount of Al is preferably 30 atomic percent or more, and more preferably, 50 atomic percent or less.

Ge is not necessarily included, but considering that the too much amount of Ge degrades the characteristics of writing retention, the amount of Ge for addition is preferably 15 atomic percent or less.

Note that, in this embodiment, any other elements can be added for the purpose of, for example, preventing the memory layer 5 from falling off during a high-temperature heat treatment. For example, Silicon (Si) is an additive element possibly improving the characteristics of retention at the same time, and is preferably added to the ion source layer 3 together with Zr. Note that, if the addition amount of Si is not enough, such effects as preventing the memory layer 5 from falling off are not expected, but if the addition amount thereof is too much, the resulting characteristics of a memory operation are not satisfactory. Therefore, the amount of Si in the ion source layer 3 is desirably within a range of about 10 to 45 atomic percent. By forming a memory element as such, the characteristics of retention can be largely improved with every possible resistance range, and such large improvements of the characteristics of retention accordingly enable the multi-level recording.

In the below, described is a manufacturing method of the memory element 10 in this embodiment.

First of all, on a substrate formed with a CMOS circuit such as selective transistor, the lower electrode 1 made of W or others is formed. Thereafter, if required, any oxide or others on the surface of the lower electrode 1 are removed by bias sputtering, for example. Next, the high-resistance layer 2 configured by a Gd oxidized film is formed. For example, using a Gd target, after a metal Gd film is formed with the film thickness of 1 nm, for example, the resulting film is oxidized by oxygen plasma. Next, the ion source layer 3, e.g., CuZrTeAlGe film, is formed by DC magnetron sputtering. Next, for use as the upper electrode 4, a W (tungsten) film is formed, for example. In such a manner, a lamination film is formed.

Thereafter, out of the layers in this lamination film, the high-resistance layer 2, the ion source layer 3, and the upper electrode 4 are subjected to patterning by plasma etching or others. Other than such plasma etching, the pattering can be performed using the method of etching such as ion milling, and RIE (Reactive Ion Etching). Next, a wiring layer is formed so as to contact with the upper electrode 4, and the resulting layer is then connected with a contact portion so that all of the memory elements 10 obtain the common potential. Next, the lamination film is subjected to a heat treatment. In this manner, the memory element 10 can be manufactured.

As described above, with the memory element 10 in this embodiment, since the ion source layer 3 includes not only a chalcogen element but also metal elements of Zr, Cu, and Al, and also Ge, the characteristics of data retention are excellent. Moreover, even if the transistor is reduced in current drive force as a result of the size reduction, information retention is still possible. Therefore, by configuring a memory device using such a memory element 10, the resulting device can be small in size with a higher density. Moreover, all of the layers including the lower electrode 1, the high-resistance layer 2, the ion source layer 3, and the upper electrode 4 can be made of a material possibly subjected to sputtering, and therefore the manufacturing process may be simplified. In other words, the layers may be subjected to sputtering one by one each using a target of a composition suitable for the material of the layer. Alternatively, films may be formed one by one by target exchange in any one sputtering device.

By arranging the above-described memory element 10 plurally in line or in a matrix, for example, a memory device (memory) can be configured. In this case, if required, the memory elements 10 may be each connected with a MOS transistor for element selection use or with a diode to configure a memory cell. The resulting memory cell may be also connected to, via a wiring, a sense amplifier, an address decoder, or a circuit for writing, deletion, and reading, for example.

Figure 3:
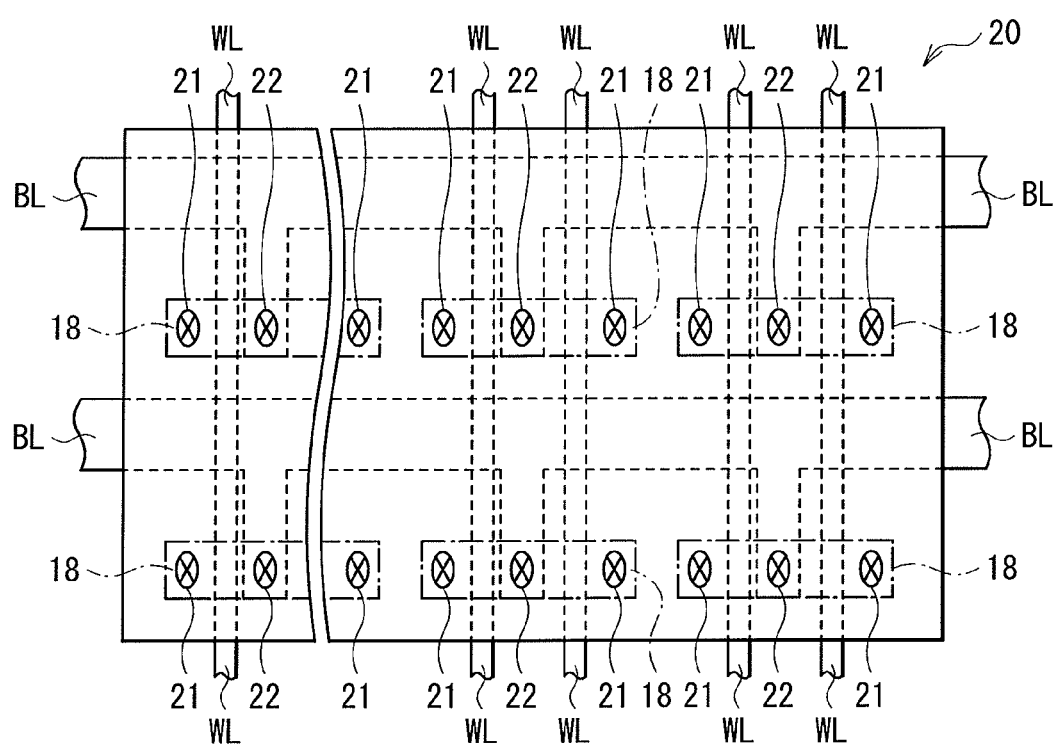
FIG. 3 A plan view of also the memory cell array.

FIGS. 2 and 3 each show an exemplary memory device (memory cell array 20) in which a large number of memory elements 10 are arranged in a matrix. FIG. 2 shows the cross sectional configuration thereof, and FIG. 3 shows the plane configuration thereof. In this memory cell array 20, with respect to each of the memory elements 10, a wiring connected to the side of the lower electrode 1 thereof is provided so as to intersect with a wiring connected to the side of the upper electrode 4 thereof. In the vicinity of each of the intersections between these wirings, the memory element 10 is disposed, for example. Moreover, the wiring connected to the side of the upper electrode 4 is formed common to the entire array, for example.

To be more specific, the memory elements 10 are sharing the layers of the high-resistance layer 2, the ion source layer 3, and the upper electrode 4. In other words, the high-resistance layer 2, the ion source layer 3, and the upper electrode 4 are each configured as a layer (a piece of layer) for shared use among the memory elements 10. Among these layers in shared use, the upper electrode 4 serves as a plate electrode PL. On the other hand, the lower electrode 1 is individually formed on the memory cell basis so that the memory cells are separated from each other electrically. By the lower electrode 1 provided to each of the memory cells, the memory element 10 is defined by position in the corresponding memory cell to come at the position corresponding to its lower electrode 1. The lower electrodes 1 are each connected to its corresponding MOS transistor Tr for cell selection use, and the memory elements 10 are each formed above its corresponding MOS transistor Tr. The MOS transistor Tr is configured by source/drain regions 13, and a gate electrode 14. The source/drain regions 13 are formed in a region separated by an element separating layer 12 in the semiconductor substrate 11. The gate electrode 14 is formed with a side wall insulation layer on its wall surface. The gate electrode 14 serves also as a word line WL being one address wiring in the memory element 10. One of the source/drain regions 13 of the MOS transistor Tr and the lower electrode 1 of the memory element 10 are electrically connected to each other via a plug layer 15, a metallic wiring layer 16, and a plug layer 17. The other of the source drain regions 13 of the MOS transistor Tr is connected to the metallic wiring layer 16 via the plug layer 15. The metallic wiring layer 16 is connected to a bit line BL (refer to FIG. 3) being another address wiring of the memory element. Note that, in FIG. 3, an active region 18 in the MOS transistor Tr is indicated by a chain line, and a contact section 21 is connected to the lower electrode 1 of the memory element 10, and a contact section 22 is connected to the bit line BL.

In this memory cell array 20, when a voltage is applied to the bit line BL with the gate of the MOS transistor Tr being turned ON by the word line WL, in any of the selected memory cells, the lower electrode 1 is applied with the voltage via the source/drain of the MOS transistor Tr. In this example, when the polarity of the voltage applied to the lower electrode 1 is negative relative to the potential level of the upper electrode 4 (plate electrode PL), the memory element 10 shows a change of resistance value to the state of low resistance as described above. This accordingly allows writing of information to the selected memory cell. Next, when the lower electrode 1 is applied with a voltage being positive relative to the potential level of the upper electrode 4 (plate electrode PL), the memory element 10 shows a change of resistance value again this time back to the state of high resistance. This accordingly allows deletion of the information written into the selected memory cell. For reading of the written information, for example, any of the memory cells is selected by the MOS transistor Tr, and the cell is applied with a voltage or current of a predetermined level. The current or voltage varies in level depending on the state of resistance of the memory element 10 at this time, and such a current or voltage is detected via the sense amplifier or others connected to the bit line BL or at the tip end of the plate electrode PL. Herein, such a voltage or current for application to the selected memory cell is set so as to be smaller than a threshold value of the voltage or others at which the memory element 10 shows a change of state of resistance value.

Such a memory device of the embodiment is applicable to various types of memory devices as described above. Such memory devices include a PROM (Programmable Read OnlyMemory) available for writing one time only, an EEPROM (Erasable Programmable ReadOnly Memory) being electrically erasable, a so-called RAM available for writing, deletion, and reproduction at a high speed, or others, and the memory device is applicable to any of such types of memories.

EXAMPLES

In the below, described are specific examples of the invention.

For the memory element 10 and the memory cell array 20 in the embodiment described above, various samples are respectively manufactured for use to study the characteristics thereof.

Sample 1

First of all, as shown in FIGS. 2 and 3, the semiconductor substrate 11 is formed with a MOS transistor Tr. Next, an insulation layer is formed so as to cover the surface of the semiconductor substrate 11, and this insulation layer is formed with a via hole. Thereafter, by CVD (Chemical Vapor Deposition), the via hole is filled therein with an electrode material made of W (tungsten), and the surface of the resulting via hole is made flat by CMP (Chemical Mechanical Polishing). Thereafter, by repeating such processes, the plug layer 15, the metallic wiring layer 16, the plug layer 17, and the lower electrode 1 are formed, and then the lower electrode 1 is subjected to patterning on the memory cell basis. This lower electrode 1 is configured so that the aperture portion thereof has the diameter of 300 nm. Next, for removing any oxide on the upper surface of the lower electrode 1, the surface is etched about 1 nm by bias sputtering using an RF power source. At this time, the lower electrode 1 is made flat on the surface to be substantially the same at height with the insulation layer. Next, by DC magnetron sputtering, a metallic Gd film is formed with the film thickness of 1.0 nm, and the Gd film is oxidized for 10 seconds by RF plasma on condition that the chamber pressure is 1 mTorr (0.133 Pa) in the $O_2$ atmosphere with the power of 500 W. The resulting Gd oxide is put in use as the high-resistance film 2.

Next, for use as the ion source layer 3, a CuZrTeAlGe film is deposited to be 45 nm in thickness. The composition thereof is Cu of 11%, Zr of 11%, Te of 29%, Al of 42%, and Ge of 7% (atomic percent). Moreover, on the ion source layer 3, a W film is formed with the film thickness of 20 nm for use as the upper electrode 4. Thereafter, the high-resistance film 2, the ion source layer 3, and the upper electrode 4 formed on the entire semiconductor substrate 11 are subjected to patterning in such a manner that the portion of the entire memory cell array 20 (memory portion) is left as it is. Thus, the memory element 10 shown in FIG. 1 is formed, and the upper electrode 4 is subjected to etching on the surface, and therefore a wiring layer (Al layer) with the thickness of 200 nm is formed for a connection to the contact portion where an external circuit is connected for provision of an intermediate potential (Vdd/2). Thereafter, in a furnace for a vacuum heat treatment, the resulting structure is subjected to the heat treatment for two hours at the temperature of 300° C. In this manner, the memory cell array 20 shown in FIGS. 2 and 3 is manufactured, and is used as a sample 1.

Also manufactured are the memory cell arrays 20 each including the memory element 10 similar to that in the sample 1 except the configuration of the ion source layer 3, and are used as samples 2 to 52.

Experiment 1

Samples 2 to 8

For use as the ion source layer 3, a ZrTeAl layer (Cu/Zr=0) with the following composition ratio is deposited to be 45 nm in thickness. Note that the expression of "%" in the below means "atomic percent".
Sample 2 Zr 10%-Te 50%-Al 40%
Sample 3 Zr 13%-Te 46%-Al 41%
Sample 4 Zr 16%-Te 43%-Al 41%
Sample 5 Zr 20%-Te 41%-Al 39%
Sample 6 Zr 22%-Te 37%-Al 41%
Sample 7 Zr 26%-Te 35%-Al 39%
Sample 8 Zr 28%-Te 32%-Al 40%

Samples 10 to 15

For use as the ion source layer 3, a CuZrTeAl layer (Cu/Zr=1) with the following composition ratio is deposited to be 45 nm in thickness.
Sample 10 Cu 5%-Zr 5%-Te 38%-Al 52%
Sample 11 Cu 7.5%-Zr 7.5%-Te 37%-Al 48%
Sample 12 Cu 9%-Zr 9%-Te 35%-Al 47%
Sample 13 Cu 13%-Zr 13%-Te 31%-Al 43%

Sample 14 Cu 14%-Zr 14%-Te 30%-Al 41%
Sample 15 Cu 18%-Zr 18%-Te 27%-Al 37%

Samples 20 to 25

For use as the ion source layer 3, a CuZrTeAl layer (Cu/Zr=2) with the following composition ratio is deposited to be 45 nm in thickness.
Sample 20 Cu 12%-Zr 6%-Te 42%-Al 40%
Sample 21 Cu 14%-Zr 7%-Te 39%-Al 40%
Sample 22 Cu 16%-Zr 8%-Te 35%-Al 41%
Sample 23 Cu 18%-Zr 9%-Te 33%-Al 40%
Sample 24 Cu 21%-Zr 10%-Te 29%-Al 40%
Sample 25 Cu 24%-Zr 12%-Te 24%-Al 40%

Samples 30 to 35

For use as the ion source layer 3, a CuZrTeAl layer (Cu/Zr=4) with the following composition ratio is deposited to be 45 nm in thickness.
Sample 30 Cu 17%-Zr 4%-Te 39%-Al 40%
Sample 31 Cu 20%-Zr 5%-Te 35%-Al 40%
Sample 32 Cu 24%-Zr 6%-Te 30%-Al 40%
Sample 33 Cu 26%-Zr 7%-Te 27%-Al 40%
Sample 34 Cu 32%-Zr 8%-Te 20%-Al 40%
Sample 35 Cu 36%-Zr 9%-Te 15%-Al 40%

Samples 4, and 40 to 43

For use as the ion source layer 3, a film with the following composition ratio is deposited to be 45 nm in thickness using Zr as a metal element that is to be ionized. With the equivalence ratio between Zr and Te as being constant (=1), the composition ratio of Al is changed to 20, 31, 41, 50, and 61%.
Sample 40 Zr 22%-Te 58%-Al 20%
Sample 41 Zr 20%-Te 50%-Al 30%
Sample 4 Zr 16%-Te 43%-Al 41%
Sample 42 Zr 14%-Te 36%-Al 50%
Sample 43 Zr 11%-Te 28%-Al 61%

Samples 1, 13, 51, and 52

For use as the ion source layer 3, a CuZrTeAlGe layer with the following composition ratio is deposited to be 45 nm in thickness. The composition ratio of Ge is changed to 0, 7, 10, 15, and 20%.
Sample 13 Cu 13%-Zr 13%-Te 31%-Al 43%
Sample 1 Cu 11%-Zr 11%-Te 29%-Al 42%-Ge 7%
Sample 51 Cu 8.5%-Zr 8.5%-Te 28%-Al 40%-Ge 15%
Sample 52 Cu 10%-Zr 10%-Te 20%-Al 40%-Ge 20%
Herein, the samples 1, 3 to 7, 11 to 14, 22 to 25, 34, 35, 41, and 42 are each an example, and the samples 2, 8, 10, 15, 20, 21, 30 to 33, 40, 43, 51, and 52 are each a comparison example.

Assessment of Characteristics

Experiment 1

Figure 4:
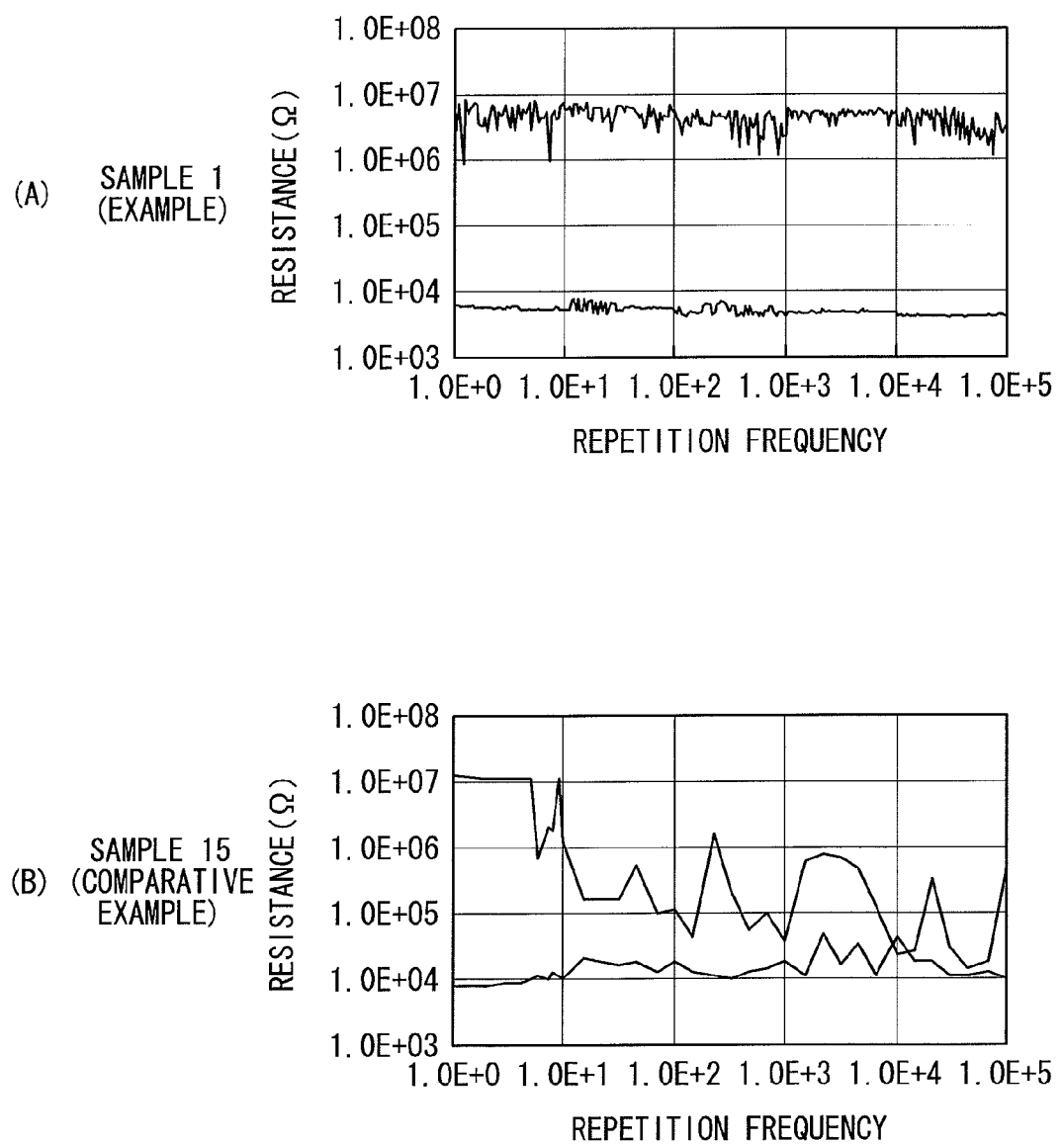
FIG. 4 A diagram showing the characteristics of repetition during a high-speed operation with a sample 1 and that with a sample 14.

With respect to the cell array 20 of the memory element 10 of the sample 1, the upper wiring connected to the upper electrode 4 is set at an intermediate potential of Vdd/2, and then a voltage is applied to the gate electrode of any selected memory cell, i.e., to the word line WL, so that the state is changed to ON. Thereafter, in the source/drain regions 13 of the transistor Tr, to the electrode connected to the one of those not connected to the memory element 10, i.e., to the bit line BL, the "operation of writing" is performed to apply a voltage of 3.0V with any desired pulse width, and then reading of the resistance value is performed. This is performed to the 20 elements in total arranged in 10 elements×2 lines in the memory cell array. Next, a voltage of 3.0V is applied to the gate electrode to change the state to ON, and a voltage reverse to that during the "writing" is applied to the upper and lower electrodes to perform the "operation of deletion", thereby reading the resistance value in the state of deletion. By repeatedly performing such operations of writing and deletion to the memory cell array, the assessment can be done to the characteristics of such a repeated operation. Herein, if the pulse width during the operations of writing and deletion is reduced, for example, the assessment of the characteristics of a high-speed operation can be done. First of all, about the sample 1 (example) and the sample 15 (comparison example), FIG. 4 shows the resulting characteristics of a repeated operation performed for $10^6$ times under the high-speed pulse conditions of writing at 10 ns/deletion at 10 ns.

As such, the sample 1 (CuZrTeAlGe) being the example of the invention is available for the repeated operation for $10^6$ times or more even with the high-speed pulse conditions, and shows an excellent balance between the characteristics of writing and deletion operations and the characteristics of writing and deletion retention.

A high-temperature acceleration retention test is conducted using the sample 1 by stopping one of the two lines each including 10 elements in the state of writing after the repetition of 1000 times, and then leaving those in an oven at the temperature of 130° C. for an hour. Thereafter, the reading is performed to the resistance value in the state of writing and that in the state of deletion. A comparison is then made to the resistance values before and after such a high-temperature acceleration retention test to assess the characteristics of data retention.

Figure 5:
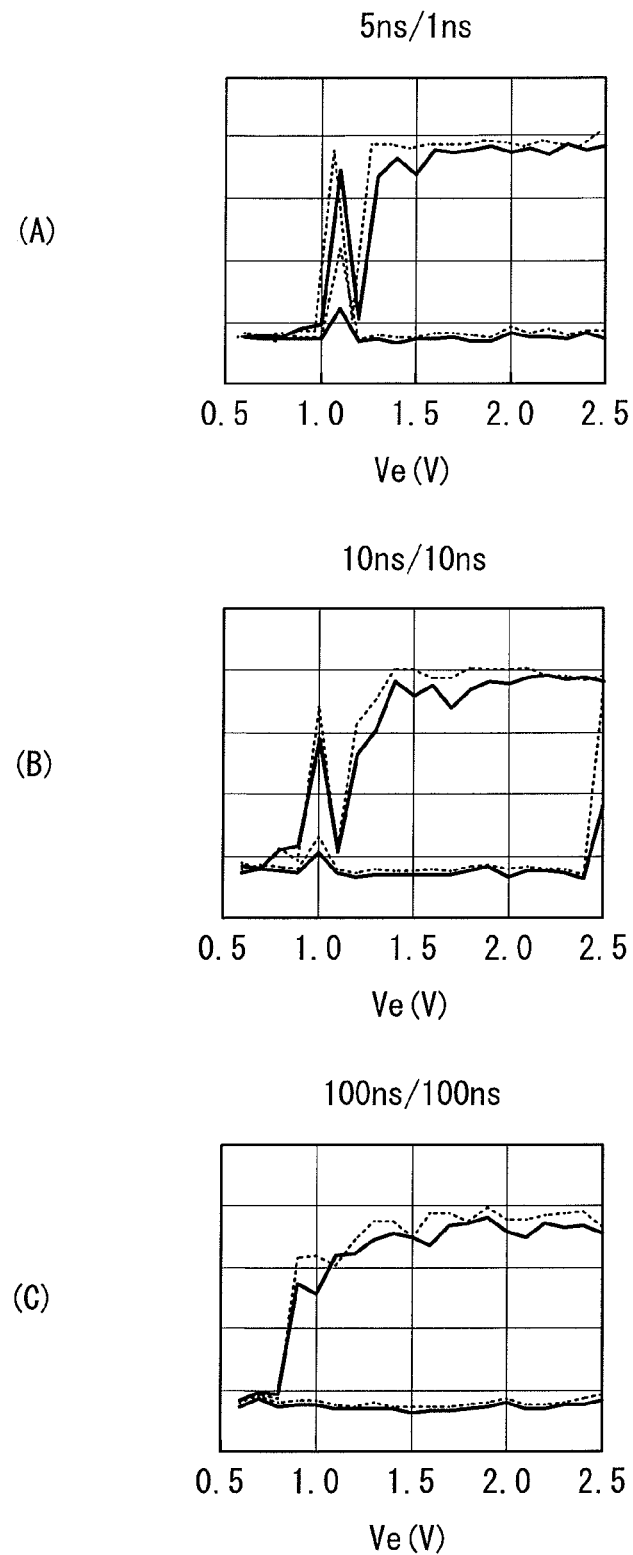
FIG. 5 A characteristics diagram showing the dependence of the sample 1 on a deletion voltage when a resistance value thereof is in the state of writing and is in the state of deletion.

First of all, the resistance value after the repetition of 1000 times is checked under various different conditions by changing a deletion voltage Ve from 0.7 to 2.5V, with the pulse width for writing and deletion being 5 ns/1 ns, 10 ns/10 ns, and 100 ns/100 ns, a writing voltage Vw of 3.0V, a writing gate voltage Vgw of 1.3V to allow a flow of current of about 110 µA, and a deletion gate voltage of 3.0V. A memory array including 20 elements×2 lines is used by stopping one of the lines in the state of writing, and by stopping the remaining line in the state of deletion. Thereafter, the resistance value in the state of writing and that in the state of deletion are measured. Thereafter, the resulting resistance value in the state of writing and that in the state of deletion are checked for their dependence on the deletion voltage before and after the high-speed acceleration retention at the temperature of 130° C. for an hour. The result is shown in FIG. 5. The solid line therein indicates the resistance values before retention, and the dotted line indicates the resistance values after retention.

Although the high-speed operation generally causes difficulty in performing the operation with a good stability, even with a high-speed pulse of 5 ns or shorter, the operation can be performed with a wider range of voltage application conditions, and this tells that the operation can be performed also with the high-speed operation conditions. Moreover, in the graphs, the solid lines each indicate the resistance value read immediately after the data writing, and the broken lines each indicate the resistance value after the retention acceleration test at the temperature of 130° C. As is known from the result, even the writing and deletion operations are performed under the high-speed conditions, the resistance values are retained. In other words, this tells that the sample 1 being an example of the invention is achieving, at a higher level, the writing and deletion at a high speed, the data retention at that time, and the characteristics of repetition for $10^6$ times or more.

Experiment 2

Next, for determining the range of a composition that can realize the memory characteristics in need with a good balance at a higher level, an experiment is conducted to check the dependence of cationizing elements and anionizing elements on a ratio therebetween when Cu/Zr=0, 1, 2, and 4 as an experiment to find a suitable composition ratio of ZrTeAl or CuZrTeAl not including Ge from the composition of the sample 1. The result is shown as below.

Figure 6:
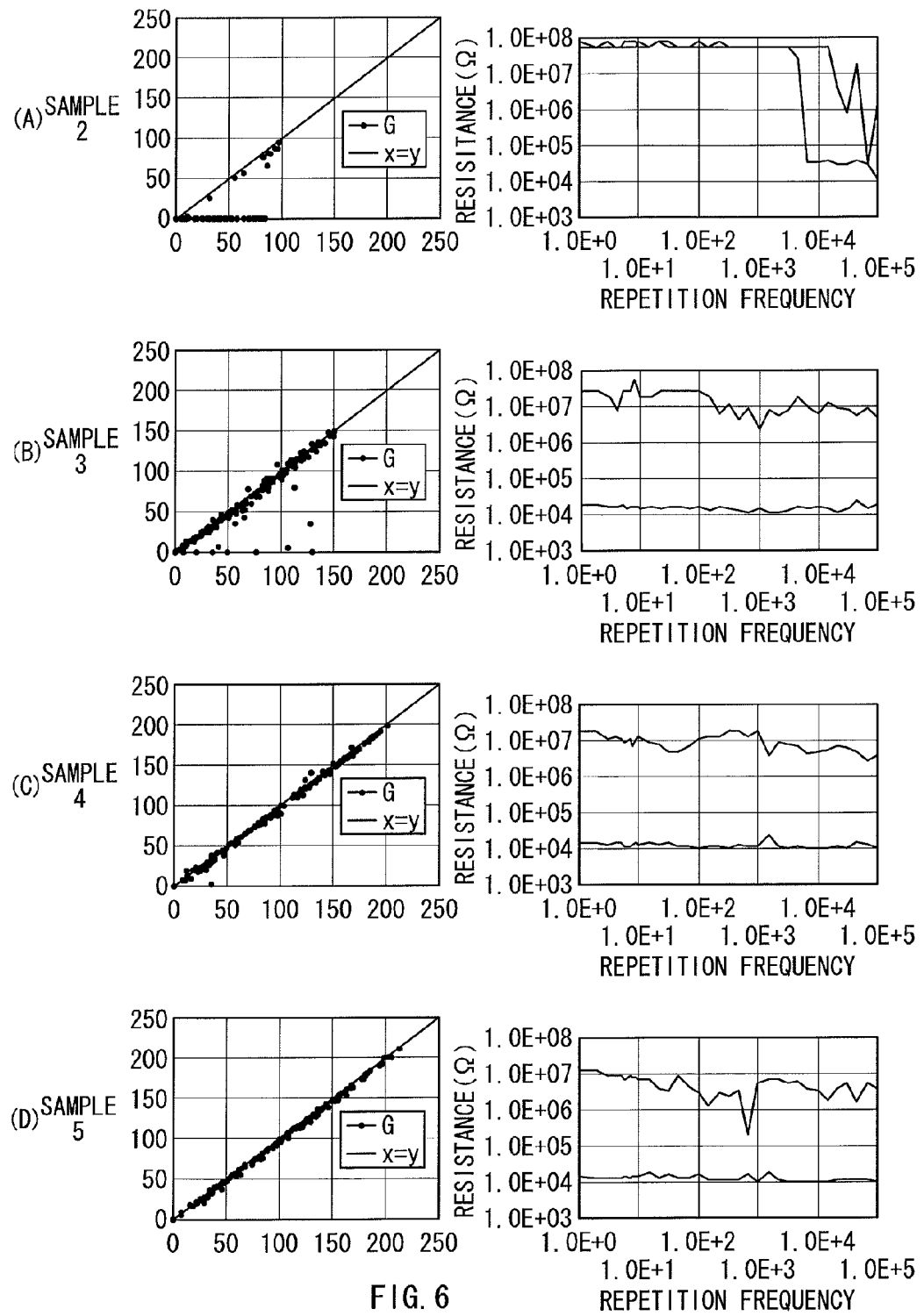
FIG. 6 A scatter diagram of resistance values of each of samples 2 to 5 being plotted when any change is observed therein before and after a retention/acceleration test, and a diagram showing the characteristics of repetition each thereof.
Figure 7:
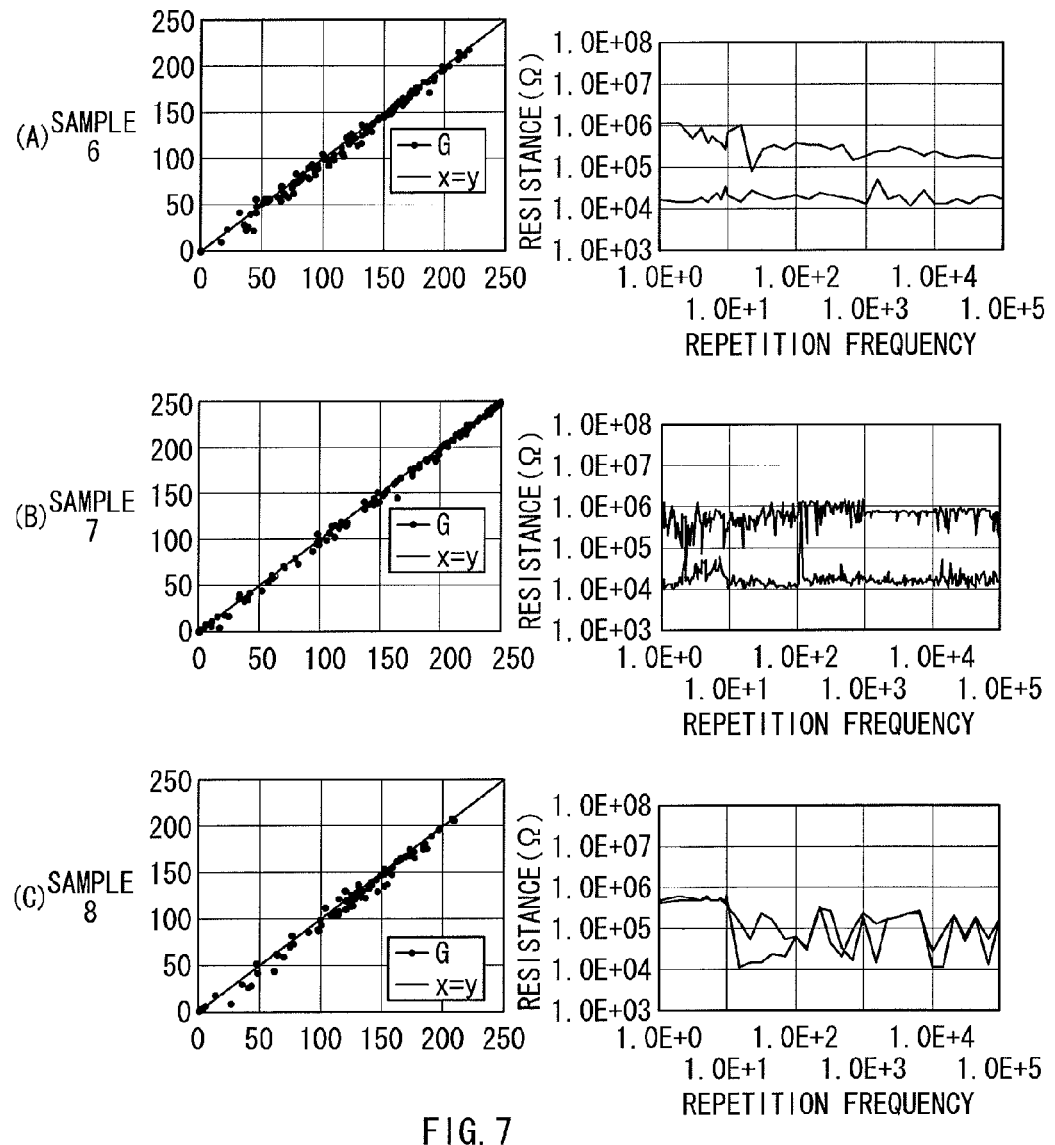
FIG. 7 A scatter diagram of resistance values of each of samples 6 to 9 being plotted when any change is observed therein before and after the retention/acceleration test, and a diagram showing the characteristics of repetition each thereof.

The result of the samples 2 to 8 with Cu/Zr=0 is shown in FIGS. 6 and 7, and Table 1.

TABLE 1

| Sample Number | Cu (%) | Zr (%) | Te (%) | Al (%) | Zr/Te | Retention | Repetition |
|---|---|---|---|---|---|---|---|
| sample 2 | 0 | 10 | 50 | 40 | 0.20 | NO | NO |
| sample 3 | 0 | 13 | 46 | 41 | 0.28 | YES | YES |
| sample 4 | 0 | 16 | 43 | 41 | 0.37 | YES | YES |
| sample 5 | 0 | 20 | 41 | 39 | 0.54 | YES | YES |
| sample 6 | 0 | 22 | 37 | 41 | 0.59 | YES | YES |
| sample 7 | 0 | 26 | 35 | 39 | 0.74 | YES | YES |
| sample 8 | 0 | 28 | 32 | 40 | 0.88 | YES | NO |

With the samples 2 to 8, the composition ratio of Zr/Te is changed from 0.2 to 0.88, and when the amount of Zr is little, the characteristics of repetition and retention are not both satisfactory, and with the increase of the composition of Zr, the characteristics of retention are improved. On the other hand, the samples 3 to 7 show the satisfactory characteristics of repetition, but when the Zr/Te ratio of the sample 8 reaches 0.88, the repetition becomes difficult. Accordingly, with Cu/Zr=0, as shown in Table 1, the equivalence ratio of Zr/Te is required to fall within a range from 0.28 to 0.74 both inclusive to obtain the satisfactory characteristics.

Figure 8:
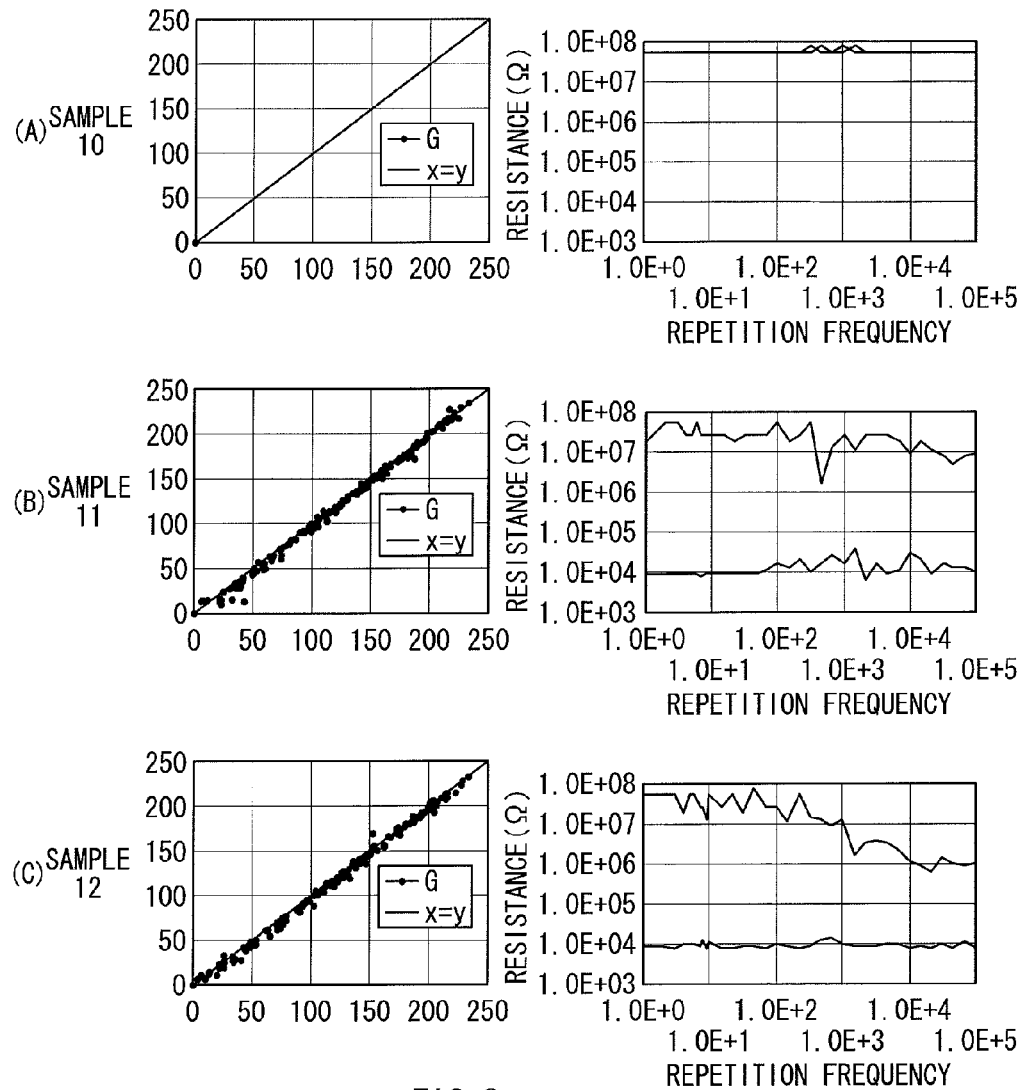
FIG. 8 A scatter diagram of resistance values of each of samples 10 to 12 being plotted when any change is observed therein before and after the retention/acceleration test, and a diagram showing the characteristics of repetition each thereof.
Figure 9:
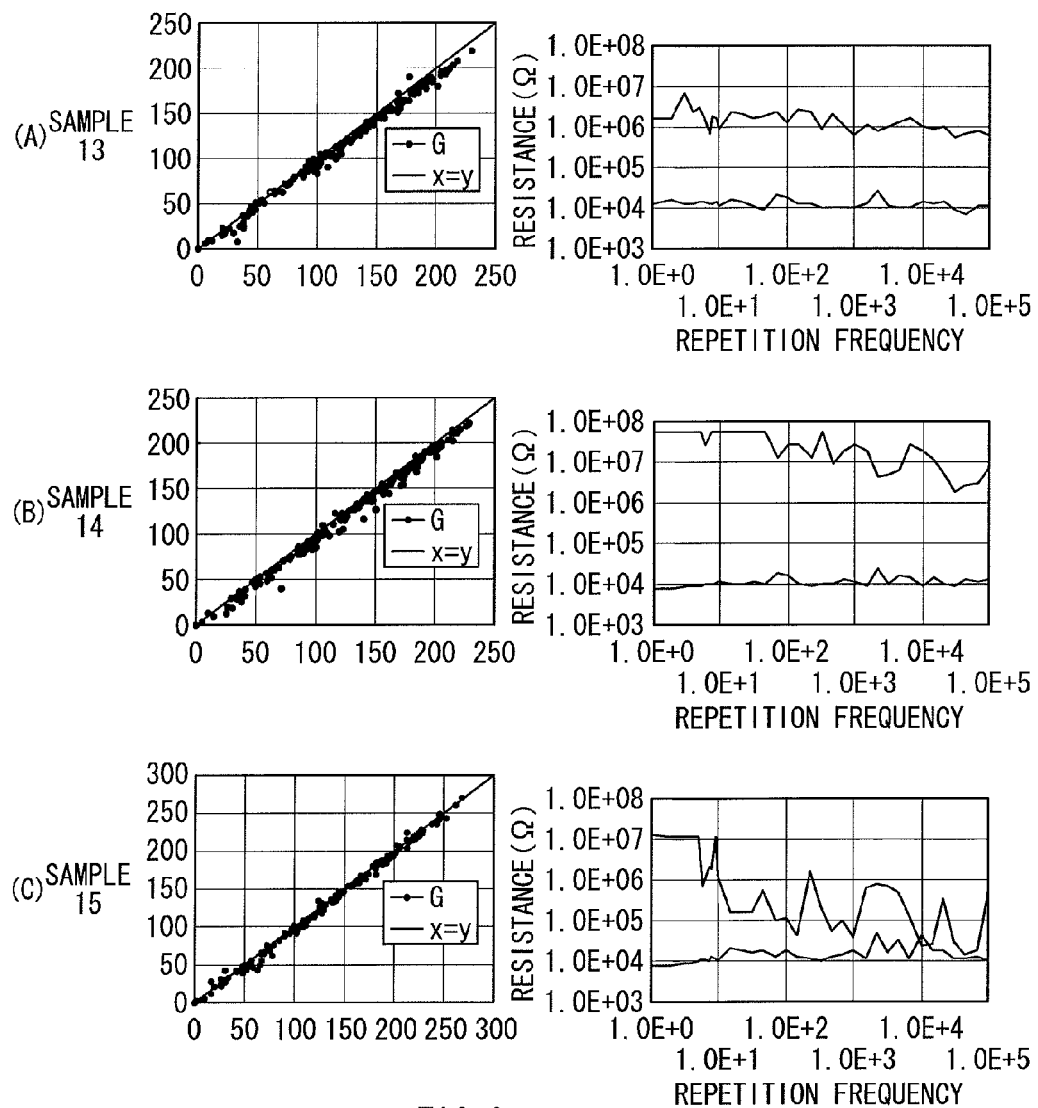
FIG. 9 A scatter diagram of resistance values of each of samples 13 to 15 being plotted when any change is observed therein before and after the retention/acceleration test, and a diagram showing the characteristics of repetition each thereof.

The result of the samples 10 to 15 with Cu/Zr=1 is shown in FIGS. 8 and 9, and Table 2.

TABLE 2

| Sample Number | Cu (%) | Zr (%) | Te (%) | Al (%) | Zr/Te | Retention | Repetition |
|---|---|---|---|---|---|---|---|
| sample 10 | 5 | 5 | 38 | 52 | 0.13 | NO | NO |
| sample 11 | 7.5 | 7.5 | 37 | 48 | 0.20 | YES | YES |
| sample 12 | 9 | 9 | 35 | 47 | 0.26 | YES | YES |
| sample 13 | 13 | 13 | 31 | 43 | 0.42 | YES | YES |
| sample 14 | 14 | 14 | 30 | 41 | 0.47 | YES | YES |
| sample 15 | 18 | 18 | 27 | 37 | 0.67 | YES | NO |

Similarly to the case with Cu/Zr=0, when the equivalence ratio of Zr/Te is smaller than 0.2, the operation characteristics are not satisfactory. Moreover, when the equivalence ratio of Zr/Te becomes larger than 0.47, the characteristics of retention are still satisfactory, but the characteristics of repetition are to be reduced. In order to obtain the good-balanced memory characteristics in the case with Cu/Zr=1, the amount of Zr is required to be 7.5% or more, and the equivalence ratio of Zr/Te is required to fall within a range from 0.2 to 0.47 both inclusive.

Figure 10:
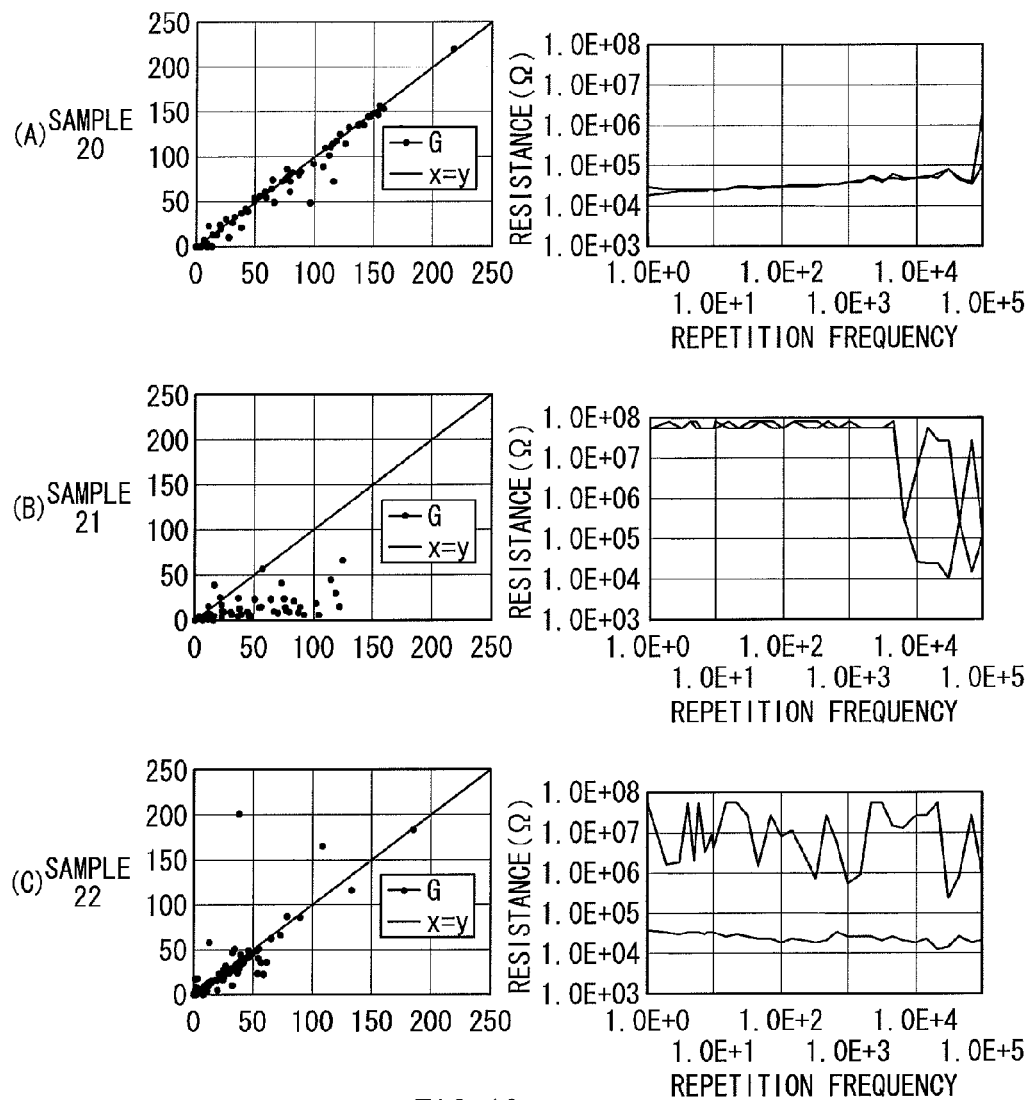
FIG. 10 A scatter diagram of resistance values of each of samples 20 to 22 being plotted when any change is observed therein before and after the retention/acceleration test, and a diagram showing the characteristics of repetition each thereof.
Figure 11:
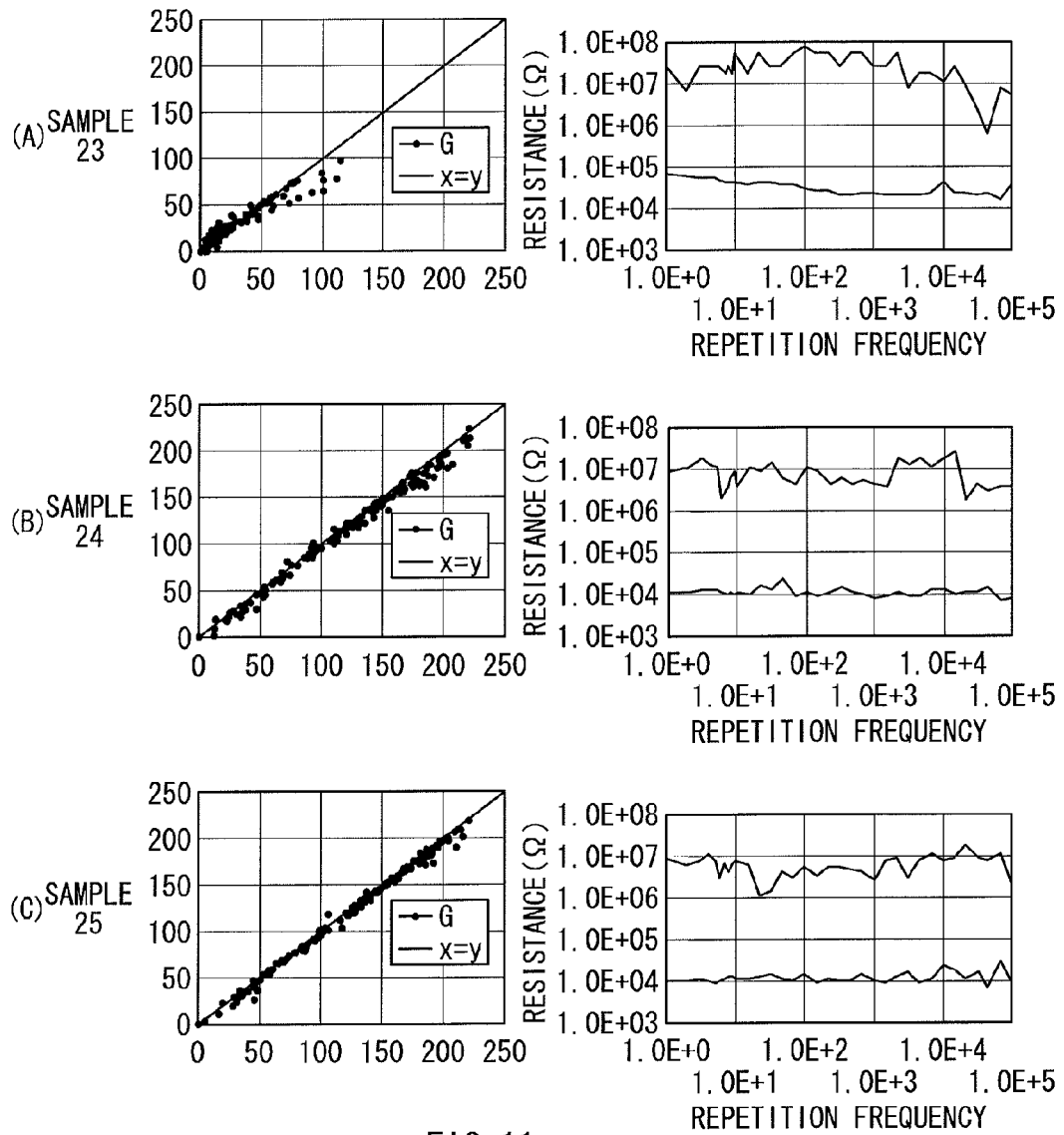
FIG. 11 A scatter diagram of resistance values of each of samples 23 to 25 being plotted when any change is observed therein before and after the retention/acceleration test, and a diagram showing the characteristics of repetition each thereof.

The result of the samples 20 to 25 with Cu/Zr=2 is shown in FIGS. 10 and 11, and Table 3.

TABLE 3

| Sample Number | Cu (%) | Zr (%) | Te (%) | Al (%) | Zr/Te | Retention | Repetition |
|---|---|---|---|---|---|---|---|
| sample 20 | 12 | 6 | 42 | 40 | 0.14 | NO | NO |
| sample 21 | 14 | 7 | 39 | 40 | 0.18 | NO | NO |
| sample 22 | 16 | 8 | 35 | 41 | 0.23 | YES | YES |
| sample 23 | 18 | 9 | 33 | 40 | 0.27 | YES | YES |
| sample 24 | 21 | 10 | 29 | 40 | 0.34 | YES | YES |
| sample 25 | 24 | 12 | 24 | 40 | 0.50 | YES | YES |

Also in the case with Cu/Zr=2, when the equivalence ratio of Zr/Te becomes large enough, the characteristics of retention are improved, and the characteristics of repetition are also improved, and thus the amount of Zr in need is supposed to be 8% or higher, and the equivalence ratio of Zr/Te in need is supposed to be 0.23 or more.

Figure 12:
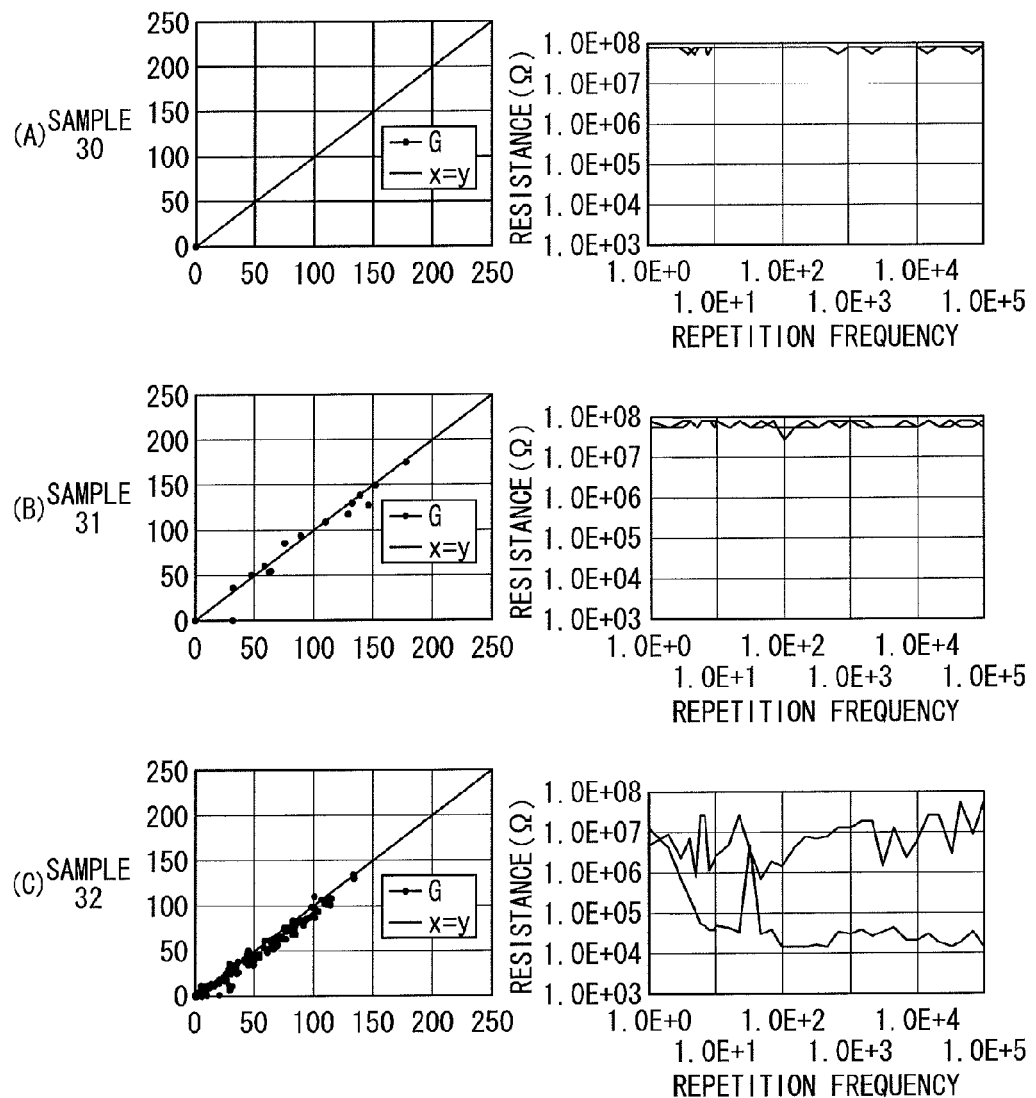
FIG. 12 A scatter diagram of resistance values of each of samples 30 to 32 being plotted when any change is observed therein before and after the retention/acceleration test, and a diagram showing the characteristics of repetition each thereof.
Figure 13:
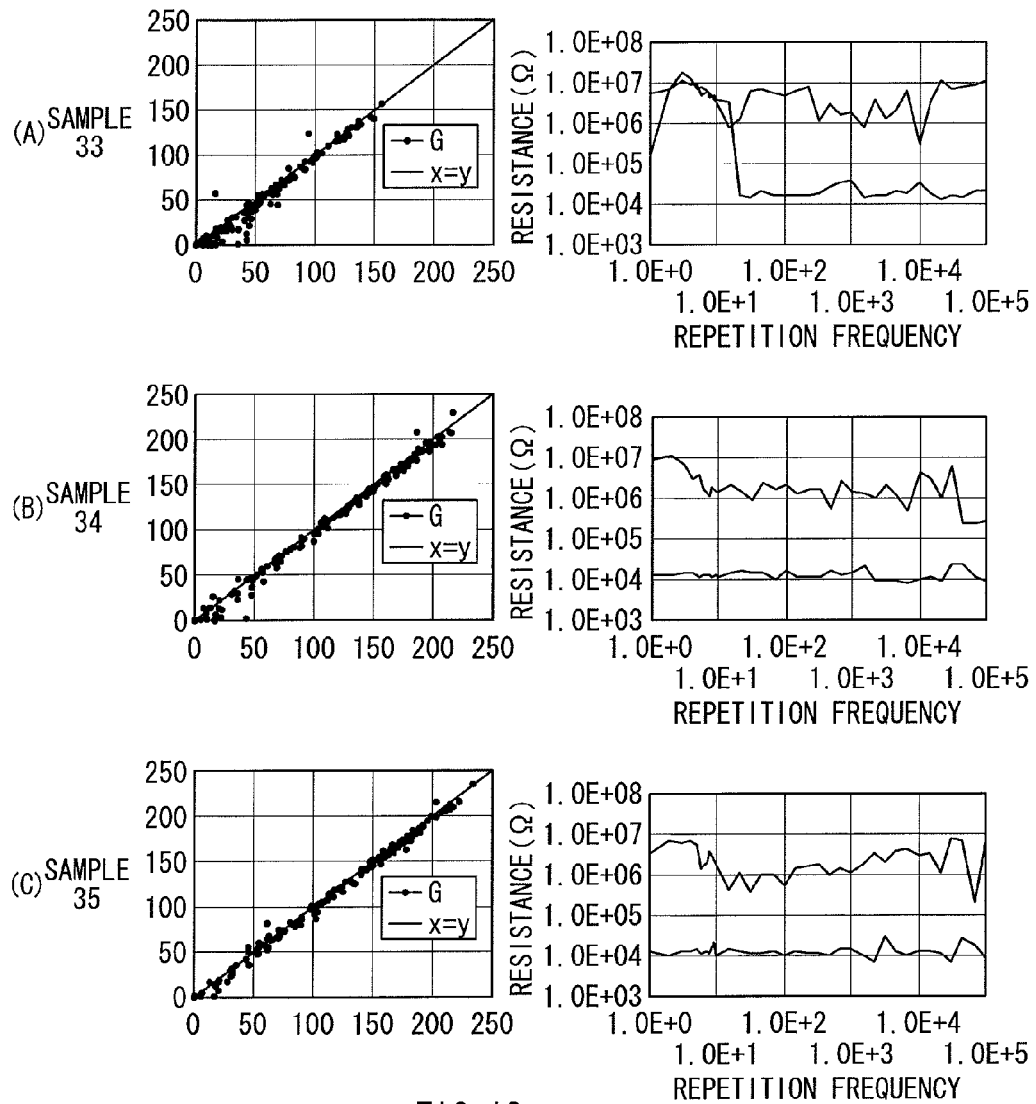
FIG. 13 A scatter diagram of resistance values of each of samples 33 to 35 being plotted when any change is observed therein before and after the retention/acceleration test, and a diagram showing the characteristics of repetition each thereof.

The result of the samples 30 to 35 with Cu/Zr=4 is shown in FIGS. 12 and 13, and Table 4.

TABLE 4

| Sample Number | Cu (%) | Zr (%) | Te (%) | Al (%) | Zr/Te | Retention | Repetition |
|---|---|---|---|---|---|---|---|
| sample 30 | 17 | 4 | 39 | 40 | 0.10 | NO | NO |
| sample 31 | 20 | 5 | 35 | 40 | 0.14 | NO | NO |
| sample 32 | 24 | 6 | 30 | 40 | 0.20 | YES | YES |
| sample 33 | 26 | 7 | 27 | 40 | 0.26 | YES | YES |
| sample 34 | 32 | 8 | 20 | 40 | 0.40 | YES | YES |
| sample 35 | 36 | 9 | 15 | 30 | 0.60 | YES | YES |

Similarly, in the case with Cu/Zr=4, with the increase of the equivalence ratio of Zr/Te, the characteristics of retention are improved, and the characteristics of repetition are also improved. However, with the samples 32 and 33 in which the equivalence ratio of Zr/Te is 0.20 and 0.26, respectively, the characteristics of retention are satisfactory but the characteristics of repetition are not considered good enough. In consideration thereof, with Cu/Zr=4, the amount of Zr is required to be 8% or more in order to obtain the good-balanced memory characteristics.

Figure 14:
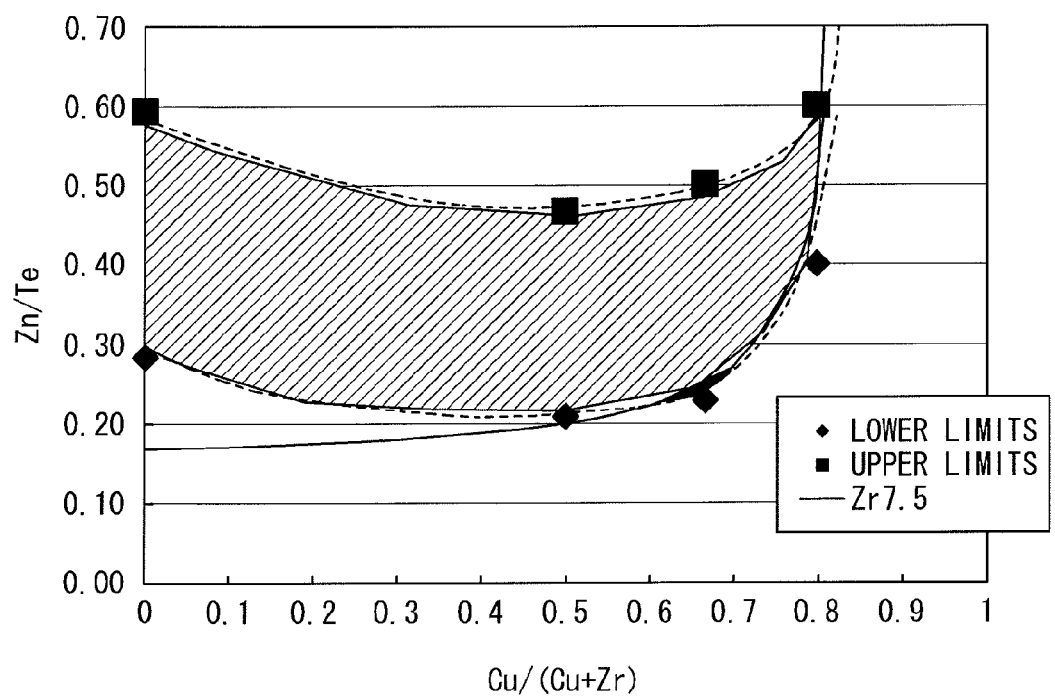
FIG. 14 A diagram showing a composition region most suitable for Cu, Zr, and Te.

With the results as above, in the case with Cu/Zr=0, 1, 2, and 4, for realizing the memory characteristics with a good balance at a higher level, the equivalence ratio of Zr/Te is in the range from 0.2 to 0.74. Note that, in FIG. 14, the lateral axis indicates Cu/(Cu+Zr) being the equivalence ratio of Cu/Zr expressed by only a percentage of CuZr, and the vertical axis indicates the upper and lower limits of the equivalence ratio of Zr/Te being plotted thereon. FIG. 14 also shows the region of Cu/(Cu+Zr) percentage that can include 7.5% or more of Ze in amount when the amount of Al is 40%. The region of a more preferable composition is the region therearound (hatched portion), and this region indicates the most suitable relationship between Cu, Zr, and Te.

Experiment 3

Figure 15:
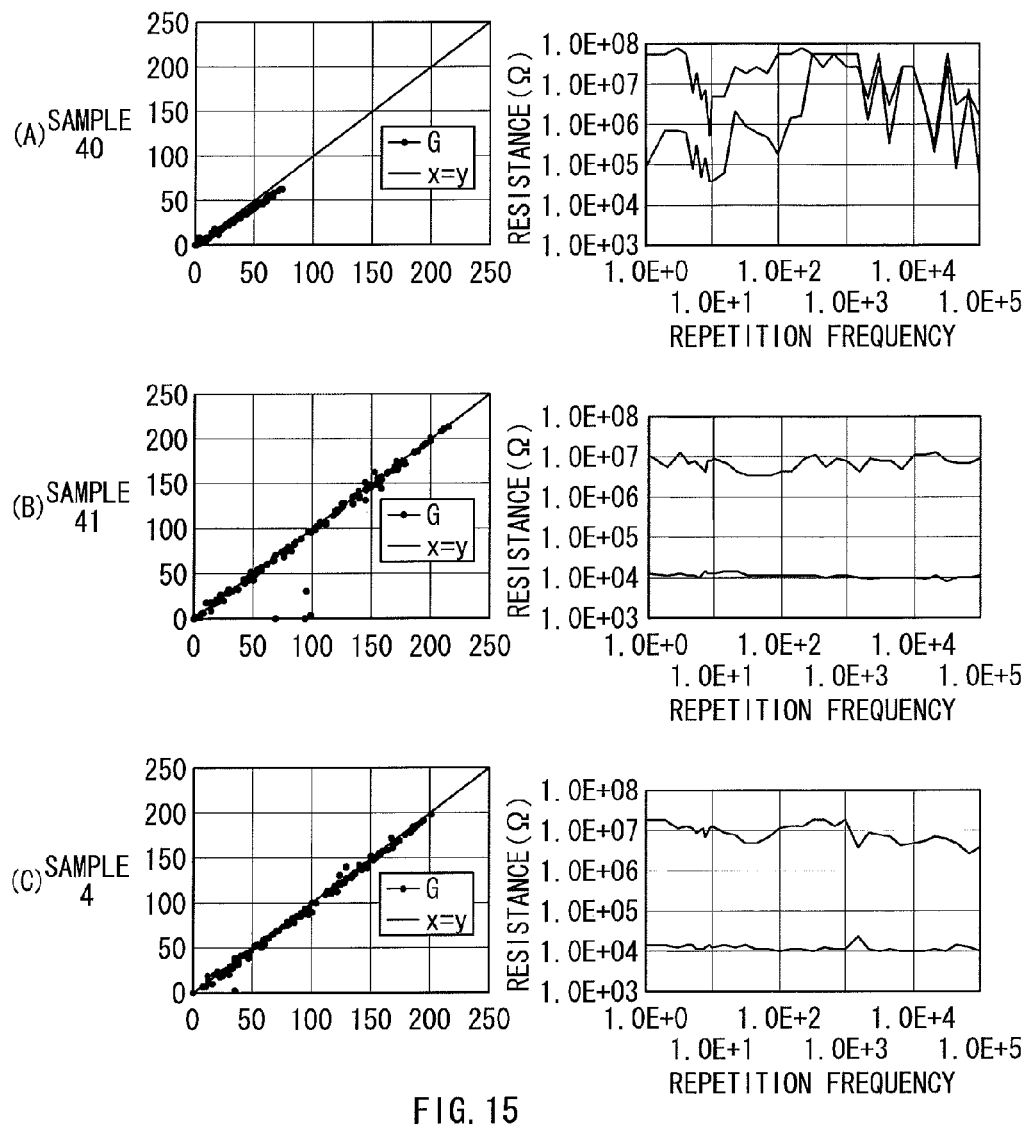
FIG. 15 A scatter diagram of resistance values of each of samples 40, 41, and 4 being plotted when any change is observed therein before and after the retention/acceleration test, and a diagram showing the characteristics of repetition each thereof.
Figure 16:
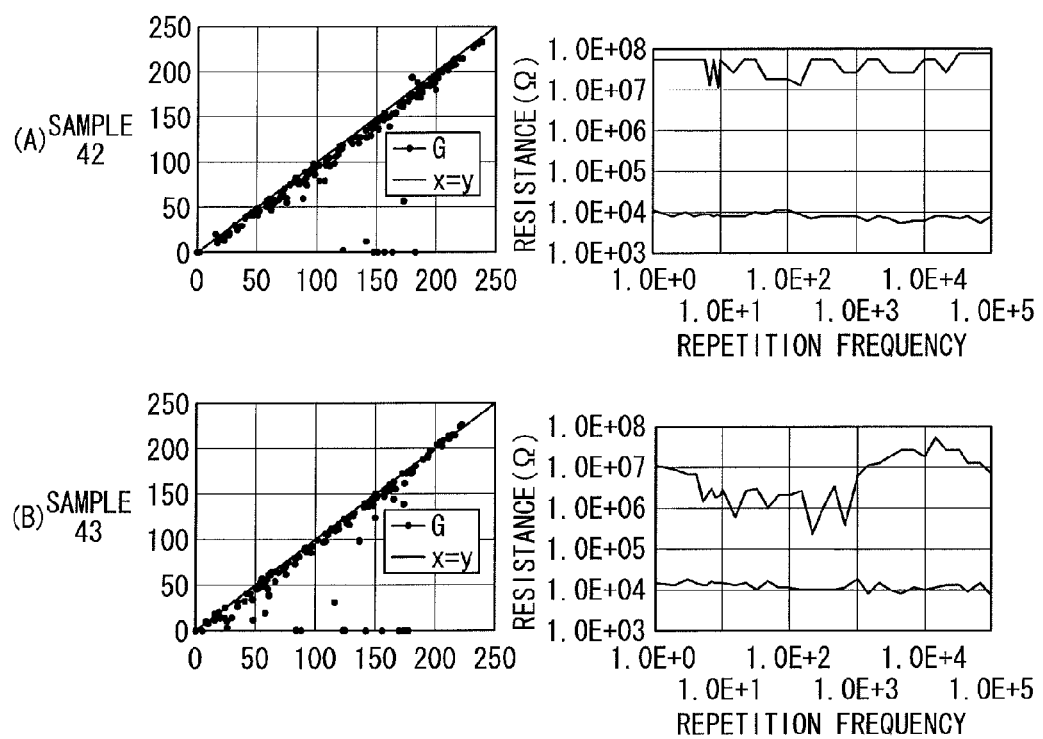
FIG. 16 A scatter diagram of resistance values of each of samples 42 and 43 being plotted when any change is observed therein before and after the retention/acceleration test, and a diagram showing the characteristics of repetition each thereof.

Next, using the samples 4, and 40 to 43, the assessment similar to Experiment 2 is conducted to check the dependence on the amount of Al. The result is shown in FIGS. 15 and 16, and Table 5.

TABLE 5

| Sample Number | Cu (%) | Zr (%) | Te (%) | Al (%) | Zr/Te | Retention | Repetition |
|---|---|---|---|---|---|---|---|
| sample 40 | 0 | 22 | 58 | 20 | 0.38 | YES | NO |
| sample 41 | 0 | 20 | 50 | 30 | 0.40 | YES | YES |

TABLE 5-continued

| Sample Number | Cu (%) | Zr (%) | Te (%) | Al (%) | Zr/Te | Retention | Repetition |
|---|---|---|---|---|---|---|---|
| sample 4 | 0 | 16 | 43 | 41 | 0.37 | YES | YES |
| sample 42 | 0 | 14 | 36 | 50 | 0.39 | YES | YES |
| sample 43 | 0 | 11 | 28 | 61 | 0.39 | NO | YES |

These results tell that, in the case where the amount of Al is 20%, the characteristics of repetition are not good enough, but are to be improved as the amount of Al is increased. On the other hand, the characteristics of retention are reduced when the amount of Al is increased to 60%. Accordingly, the appropriate amount of Al for addition is supposed to be 30 to 50%. Moreover, in comparison between the results of the samples 41, 4, and 42, the difference is small, but the sample 4 shows the best balance with the amount of Al being 41%. Thus, the more preferable amount of Al is 30 to 41%.

Experiment 4

Figure 17:
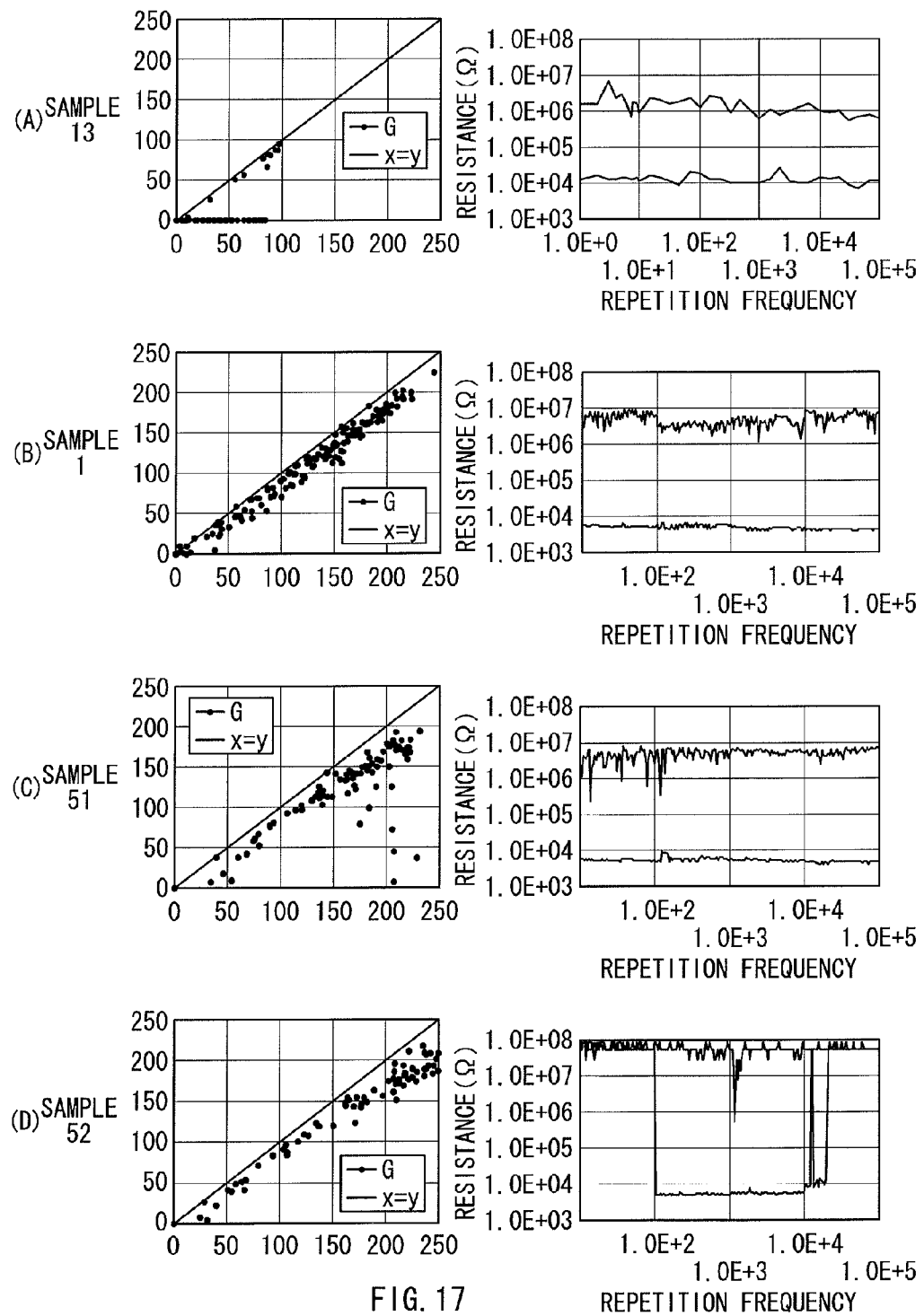
FIG. 17 A scatter diagram of resistance values of each of samples 13, 1, 51, and 52 being plotted when any change is observed therein before and after a retention/acceleration test, and a diagram showing the characteristics of repetition each thereof.

Next, using the samples 1, 13, 51, and 52, the assessment similar to Experiment 2 is conducted to check the dependence on the amount of Ge. The result is shown in FIG. 17 and Table 6.

TABLE 6

| Sample Number | Cu (%) | Zr (%) | Te (%) | Al (%) | Ge | Retention | Repetition |
|---|---|---|---|---|---|---|---|
| sample 13 | 13 | 13 | 31 | 43 | 0 | YES | YES |
| sample 1 | 11 | 11 | 29 | 42 | 7 | YES | YES |
| sample 51 | 8.5 | 8.5 | 28 | 40 | 15 | YES | YES |
| sample 52 | 10 | 10 | 20 | 40 | 20 | NO | NO |

These results tell that, by adding an appropriate amount of Ge, the characteristics of repetition are to be improved. However, when the additive amount of Ge exceeds 15%, the characteristics of retention are to be reduced, and thus the additive amount of Ge being 15% or lower is preferable.

As described above, in this example, the composition ratio of Zr/Te is 0.2 to 0.74, the additive amount of Al is 30 to 50 atomic percent, the additive amount of Zr is 7.5 to 26 atomic percent, and the additive amount of Ge is 15% or lower. Accordingly, the composition elements are to serve their roles best so that the frequency of a repeated operation can be increased. This also cancels the trade-off relationship between the performance capabilities of a high-speed operation for writing and deletion, and the characteristics of resistance value retention during the high-speed operation so that the resulting memory element 10 can have an excellent balance. Moreover, with the characteristics of resistance value retention improved as such, the intermediate state between the state of high resistance and the state of low resistance can be produced by adjusting the level of a deletion voltage during the state change from low resistance to high resistance, for example. This accordingly enables multivalued memory, thereby being able to realize the larger capacity.

Other types of transition metal element other than Zr (Ti, Hf, V, Nb, Ta, Cr, Mo, or W) may be added as long as the composition ratio described above remains the same, and other than Cu, Ag, Ni, Zn, and others may be added.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A memory element comprising:
   a first electrode;
   a second electrode; and
   a memory layer that is provided between the first and second electrodes, and is provided with an ion source layer, wherein
   the ion source layer includes at least Zr and Al together with a chalcogen element of at least one of Te, S, and Se, and an amount of the Al in the ion source layer falls within a range from 30 atomic percent to 50 atomic percent both inclusive.

2. The memory element according to claim 1, wherein the ion source layer includes Cu.

3. The memory element according to claim 1, wherein an amount of the Zr in the ion source layer falls within a range from 7.5 atomic percent to 26 atomic percent both inclusive.

4. The memory element according to claim 1, wherein a composition ratio of the Zr to the chalcogen element in total included in the ion source layer (=Zr (atomic percent)/chalcogen element in total (atomic percent)) falls within a range from 0.2 to 0.74 both inclusive.

5. The memory element according to claim 1, wherein the ion source layer includes Ge, and an amount of the Ge in the ion source layer is 15 atomic percent or less.

6. The memory element according to claim 1, wherein the memory layer includes, together with the ion source layer, a high-resistance layer whose resistance value is larger than that of the ion source layer.

7. The memory element according to claim 1, wherein the memory layer is formed therein with a current path at least including the Zr by application of a voltage to the first and second electrodes, or a resistance value is reduced due to a plurality of defects caused at least by the Zr.

8. A memory device comprising:
   a plurality of memory elements each including a memory layer including an ion source layer between a first electrode and a second electrode; and
   pulse application means for selectively applying a voltage or current pulse to the plurality of memory elements, wherein
   the ion source layer includes at least Zr and Al together with a chalcogen element of at least one of Te, S, and Se, and an amount of the Al in the ion source layer falls within a range from 30 atomic percent to 50 atomic percent both inclusive.

9. The memory device according to claim 8, wherein the plurality of memory elements each store multivalued information including values greater than binary.

10. The memory device according to claim 8, wherein in the plurality of memory elements adjacent to each other, at least a part of a layer configuring each of the memory elements is any one layer in shared use.

11. The memory device according to claim 8, wherein the layer in shared use by the plurality of memory elements is a high-resistance layer, the ion source layer, and the second electrode, and the first electrode is formed to each of the elements.

* * * * *